US009608214B2

(12) United States Patent
Lee et al.

(10) Patent No.: US 9,608,214 B2
(45) Date of Patent: *Mar. 28, 2017

(54) INTEGRATED CONDUCTIVE SUBSTRATE, AND ELECTRONIC DEVICE EMPLOYING SAME

(71) Applicant: POSTECH ACADEMY—INDUSTRY FOUNDATION, Pohang-si, Gyeongsangbuk-do (KR)

(72) Inventors: TaeWoo Lee, Pohang-si (KR); YoungHoon Kim, Daejeon (KR)

(73) Assignee: POSTECH ACADEMY-INDUSTRY FOUNDATION, Pohang-si, Gyeongsangbuk-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/394,073

(22) PCT Filed: Apr. 10, 2013

(86) PCT No.: PCT/KR2013/003009
§ 371 (c)(1),
(2) Date: Oct. 10, 2014

(87) PCT Pub. No.: WO2013/154355
PCT Pub. Date: Oct. 17, 2013

(65) Prior Publication Data
US 2015/0325803 A1    Nov. 12, 2015

(30) Foreign Application Priority Data

Apr. 10, 2012  (KR) .................. 10-2012-0037584
Apr. 10, 2013  (KR) .................. 10-2013-0039340

(51) Int. Cl.
*H01L 51/00* (2006.01)
*H01L 51/44* (2006.01)
(Continued)

(52) U.S. Cl.
CPC .... *H01L 51/0096* (2013.01); *H01L 21/02425* (2013.01); *H01L 51/442* (2013.01);
(Continued)

(58) Field of Classification Search
CPC ....... H01L 1/0096; H01L 1/52; H01L 1/5655; H01L 1/56
See application file for complete search history.

(56) References Cited

U.S. PATENT DOCUMENTS 7,834,528 B2 * 11/2010 Numajiri .................. B32B 7/02
                                                      313/116
9,184,419 B2 * 11/2015 Mandlik ............. H01L 51/0097
2005/0274412 A1 12/2005 Kang et al.

FOREIGN PATENT DOCUMENTS

JP     2006-147280 A    6/2006
JP     2006-164808 A    6/2006
(Continued)

OTHER PUBLICATIONS

International Search Report dated Jul. 11, 2013 of PCT/KR2013/003009 which is the parent application and its English translation—4 pages.

*Primary Examiner* — Yu-Hsi D Sun
(74) *Attorney, Agent, or Firm* — Knobbe Martens Olson & Bear, LLP

(57) ABSTRACT

Provided are an integrated conductive substrate simultaneously serving as a substrate and an electrode, and an electronic device using the same. The integrated conductive substrate includes a metal layer composed of a non-ferrous metal, which has a first surface having a first root mean square roughness, and a semiconductor layer containing a semiconductor material, which has a second surface having a second root mean square roughness and is formed on the first surface. Here, the semiconductor layer includes a semiconductor-type planarization layer formed by a solution
(Continued)

process using at least one of the semiconductor material and a precursor of the semiconductor material to planarize the first surface of the metal layer, and the second root mean square roughness is smaller than the first root mean square roughness.

13 Claims, 2 Drawing Sheets

(51) Int. Cl.
  *H01L 51/52* (2006.01)
  *H01L 21/02* (2006.01)
  *H05B 33/26* (2006.01)

(52) U.S. Cl.
  CPC ...... *H01L 51/5215* (2013.01); *H01L 51/5218* (2013.01); *H01L 51/5221* (2013.01); *H05B 33/26* (2013.01); *H01L 2251/305* (2013.01); *Y02E 10/549* (2013.01)

(56) References Cited

FOREIGN PATENT DOCUMENTS

| JP | 2008-115055 A | 5/2008 |
| KR | 10-2005-0117041 A | 12/2005 |
| KR | 10-0830637 B1 | 5/2008 |

* cited by examiner

INTEGRATED CONDUCTIVE SUBSTRATE, AND ELECTRONIC DEVICE EMPLOYING SAME

TECHNICAL FIELD

The present invention relates to an integrated conductive substrate and an electronic device using the same.

BACKGROUND ART

An organic light emitting diode (OLED) is a self-emissive device having a wide viewing angle, an excellent contrast ratio, a fast response time, a high brightness, a high drive voltage and a high response speed, and capable of multi-colorization.

A general OLED may include a transparent substrate, an anode, a cathode, and an organic layer interposed between the anode and the cathode. The organic layer may include a hole injection layer, a hole transport layer, an emitting layer, an electron transport layer, and an electron injection layer. Holes injected from the anode are transferred to the emitting layer via the hole transport layer, and electrons injected from the cathode are transferred to an emitting layer via the electron transport layer. The carriers such as the holes and the electrons are recombined in the emitting layer region, thereby generating excitons, which are transformed to a ground state from an excited state, resulting in a generation of light.

In an early stage of an OLED research, a small molecule OLED having a simple device structure and manufactured by depositing a low molecule material through a vacuum process had been mainly studied, and in the 2000s, flexible organic electronics could be realized, and research for realizing polymer light-emitting diodes (PLED) by a solution process which is less expensive and enables mass-production such as spin-coating, ink jet printing or roll-to-roll (R2R) coating are actively progressing.

To realize OLEDs or PLEDs having high efficiency and a long lifespan, research on multi-layered devices is mainly reported. However, as several layers are applied, a production cost is increased, and thus in consideration of commercialization, research for realizing an OLED device simplified without an additional charge transport layer is a very important issue. Also, in addition to research of realizing a PLED which is simple, stable in the air, and manufactured by a solution process, application of a structure of a device not requiring encapsulation and a printing method to a device will become a meaningful research advancing application of an R2R process for mass-production. As one method for realizing this, development of an inverted PLED using an oxide semiconductor as an electron transport layer and forming an electrode stable in the air on the uppermost portion became important.

At this stage of increasing attention to new regeneration energy around the world, organic photovoltaic cells (OPVs) having probability as future energy and various advantages are receiving attention. The OPVs can be manufactured in a thin film at a low price, compared to inorganic photovoltaic cells using silicon, and may be applied to various future flexible devices in various ways.

A conventional OPV may include an anode, a hole injection layer, a light active layer and a cathode. The light irradiated onto the OPVs may be separated into electrons and holes in the light active layer. The holes may be extracted through the anode via the hole injection layer, and the electrons may be extracted through the cathode.

To solve issues of high efficiency, a long lifespan and a simple device structure, research on inverted OPVs using metal oxides such as $TiO_2$, $ZrO_2$, and ZnO is on the rise as the most representative solutions which are stable in the air and can be applied to an R2R process.

In the inverted device, in contrast with a structure of a general OLED or OPV device in which holes are extracted through a transparent electrode such as an indium tin oxide (ITO), electrons are extracted through the transparent electrode (e.g., ITO or FTO) to serve as a cathode, and anodes generally use a metal such as Au or Ag.

Due to such a structure, the inverted device may not use a highly-reactive electron injection electrode (that is, a cathode) used in the general OLED or OPV device, a metal such as Ca, Ba or Li, but may use materials having no reactivity to an air or moisture because both of the anode and cathode have high work functions. Although organic materials may be used as an electron injection layer of an inverted PLED or OPV device, particularly, since a metal oxide has high transparency in a visible region and high charge transport capability, and is stable in the air, there is various research for applying such a metal oxide formed in a solution process to the progressing inverted device.

However, when a conventional oxide electrode such as ITO or FTO, which is disposed on a glass substrate, is bent so as to cause a crack in a thin film, it cannot serve as an electrode any more. In addition, although the conventional glass substrate is used since a substrate should also withstand a process of depositing a metal oxide performed in a high temperature process at 200° C. or more, the glass substrate is not flexible. Accordingly, it is necessary to use a substrate and an electrode, which has excellent mechanical strength to be bendable and can endure a high temperature process of 200° C. or more. As such a substrate, a metal foil may be used, but the prior art disclosed that when the metal foil is used, a device is realized by further depositing an electrode after forming an insulating planarization layer, or a device having a complicated structure is realized by further depositing a metal serving as a planarization layer and a reflective conductive layer on the metal foil.

DISCLOSURE

Technical Problem

The present invention is directed to providing an integrated conductive substrate simultaneously serving as a substrate and an electrode and an electronic device using the same.

Technical Solution

One aspect of the present invention provides an integrated conductive substrate simultaneously serving as a substrate and an electrode, which includes a metal layer composed of a non-ferrous metal, which has a first surface having a first root mean square roughness (Rq), and a semiconductor layer containing a semiconductor material, which is formed on the first surface and has a second surface having a second root mean square roughness (Rq). Here, the semiconductor layer includes a semiconductor-type planarization layer formed by a solution process using at least one of the semiconductor material and a precursor of the semiconductor material to planarize the first surface of the metal layer, and the second root mean square roughness (Rq) is smaller than the first root mean square roughness (Rq).

The first root mean square roughness (Rq) of the integrated conductive substrate may be 10 nm or more, and the second root mean square roughness (Rq) may be less than 10 nm.

The non-ferrous metal may include at least one metal selected from copper, aluminum, gold, platinum, palladium, silver, nickel, lead, niobium, zinc and tin.

The semiconductor material included in the semiconductor layer may be at least one selected from $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$) molybdenum oxide ($MoO_3$ or $MoO_x$), copper (II) oxide (CuO), nickel oxide (NiO), copper aluminum oxide ($CAOCuAlO_2$), zinc rhodium oxide ($ZROZnRh_2O_4$), iron oxide, chromium oxide, bismuth oxide, indium-gallium zinc oxide (IGZO) and $ZrO_2$.

Another aspect of the present invention provides a method of manufacturing an integrated conductive substrate, which includes preparing a metal layer composed of a non-ferrous metal, which has a first surface having a first root mean square roughness (Rq), and forming a semiconductor layer containing a semiconductor material, which is formed on the first surface of the metal layer and has a second surface having a second root mean square roughness (Rq). Here, the forming of the semiconductor layer includes a process of forming a semiconductor-type planarization layer by providing a first mixture including at least one of the semiconductor material and a precursor of the semiconductor material and a solvent and removing the solvent to planarize the first surface of the metal layer, and the second root mean square roughness (Rq) is smaller than the first root mean square roughness (Rq).

Still another aspect of the present invention provides an electronic device using the integrated conductive substrate.

The integrated conductive substrate of the electronic device may simultaneously serve as i) a substrate and a cathode, or ii) a substrate and an anode.

In the electronic device, a bottom surface of the metal layer of the integrated conductive substrate may be in contact with an external air.

In the electronic device, a pixel defining film may be patterned on the semiconductor layer of the integrated conductive substrate.

The electronic device may be a flexible inverted OLED, which includes the integrated conductive substrate, a transparent anode facing the semiconductor layer of the integrated conductive substrate, and an emitting layer interposed between the semiconductor layer and the transparent anode of the integrated conductive substrate, and the integrated conductive substrate simultaneously serves as a substrate and a cathode.

Alternatively, the electronic device may be a flexible inverted OPV, which includes the integrated conductive substrate, a transparent anode facing the semiconductor layer of the integrated conductive substrate, and a light active layer interposed between the semiconductor layer of the integrated conductive substrate and the transparent anode, and the integrated conductive substrate simultaneously serves as a substrate and a cathode.

Advantageous Effects

Since an integrated conductive substrate simultaneously serving as a substrate and an electrode has excellent mechanical strength, surface planarization and conductivity, it can be usefully applied to an electronic device (e.g., an OLED or OPV) stable in the air. In addition, the integrated conductive substrate has flexibility and can be manufactured on a large scale at a low price.

MODES OF INVENTION

Hereinafter, exemplary embodiments of the present invention will be described in detail with reference to the accompanying drawings.

Figure 1:
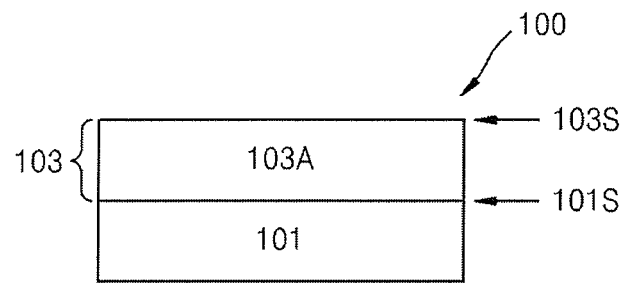
FIG. 1 is a schematic diagram of an integrated conductive substrate according to an exemplary embodiment.

FIG. 1 is a schematic diagram of a cross-section of an integrated conductive substrate 100 according to an exemplary embodiment.

The integrated conductive substrate 100 includes i) a metal layer 101, and ii) a semiconductor layer 103 composed of a semiconductor-type planarization layer 103A in contact with a first surface 101S of the metal layer 101. The first surface 101S of the metal layer 101 has a first root mean square roughness (Rq), and a second surface 103S of the semiconductor layer 103 has a second root mean square roughness (Rq). The second root mean square roughness (Rq) is smaller than the first root mean square roughness (Rq).

The metal layer 101 is a non-transparent metal layer, and has a monolayer structure. The metal layer 101 is composed of a non-ferrous metal.

The "non-ferrous metal" used herein is a metal, excluding iron (Fe).

The metal layer 101 may be a metal foil. Accordingly, the integrated conductive substrate 100 may have flexibility.

The metal layer 101 may include a non-ferrous metal, for example, at least one metal selected from copper, aluminum, gold, platinum, palladium, silver, nickel, lead, niobium, zinc and tin.

For example, the metal layer 101 may be a layer formed of one type of a metal, a layer formed by co-depositing at least two different metals, or a layer fox of an alloy of at least two different metals.

Specifically, the metal layer 101 may be a copper foil, a nickel foil, or an aluminum foil, but the present invention is not limited thereto.

The metal layer 101 may have a thickness of 50 nm to 5 mm, for example, 10 to 500 μm. When the thickness of the metal layer 101 satisfies the above range, the integrated conductive substrate 100 may be non-transparent and flexible.

The first root mean square roughness (Rq) of the first surface 101S of the metal layer 101 is a root-mean-square average roughness ($R_q$, measured by an atomic force microscope (AFM)).

The "root mean square roughness" used herein refers to the Rq value measured by the AFM.

For example, when the metal layer 101 is a metal foil, the first root mean square roughness of the first surface 101S may be 10 nm or more.

Particularly, a commercially-available copper foil may have a root mean square roughness of 100 nm or more. As a mechanical polishing, chemical mechanical polishing or electro-polishing process is performed once or twice on a surface of the commercially-available copper foil, the root mean square roughness of the copper foil may be 10 to 100 nm.

To make the first root mean square roughness of the first surface 101S of the metal layer 101 less than 10 nm, conventionally, polishing processes performed at least three times are needed, and such polishing performed three times or more are high cost processes. Here, to reduce a cost, when an organic layer (for example, an electron-injection interfacial layer, an emitting layer or a hole injection layer, etc.) of the OLED or OPV is directly faulted on the metal layer 101 having the first surface 101S having the first root mean square roughness of 10 nm or more, the OLED or OPV has an electrical short, and thus electrical characteristics of the OLED or OPV may be drastically degraded.

To solve the above-described problems, the inventor invented a semiconductor-type planarization layer 103A to reduce a high first root mean square roughness of the first surface 101S of the metal layer 101, to be formed by a low cost process and to directly apply a substrate to a device.

The semiconductor-type planarization layer 103A may be formed by a solution process using at least one of a semiconductor material and a precursor of the semiconductor material to planarize the first surface 101S of the metal layer 101.

The term "solution process" used herein means a process of forming a predetermined film by removing flowability of a mixture through a room temperature exposure process or a thermal treatment process at a room temperature or higher after the mixture having flowability is provided on a predetermined substrate.

Since the semiconductor-type planarization layer 103A is formed by a solution process, a morphology of the second surface 103S of the semiconductor-type planarization layer 103A, that is, the semiconductor layer 103, does not follow a morphology of the first surface 101S of the metal layer 101. Accordingly, the second root mean square roughness of the second surface 103S of the semiconductor-type planarization layer 103A, that is, the semiconductor layer 103, is smaller than the first root mean square roughness of the first surface 101S of the metal layer 101.

For example, the second root mean square roughness of the second surface 103S of the semiconductor layer 103 may be approximately 50% or less of the first root mean square roughness of the first surface 101S of the metal layer 101.

Particularly, the second root mean square roughness of the second surface 103S of the semiconductor-type polarization layer 103A, that is, the semiconductor layer 103, may be less than 10 nm.

Accordingly, although an organic layer (for example, an electron-injection interfacial layer, an emitting layer or a hole injection layer) of the OLED or OPV is directly formed on the second surface 103S of the semiconductor-type planarization layer 103A, that is, the semiconductor layer 103, an electrical failure such as an electrical short does not occur, and thus a high quality OLED or OPV may be realized. In addition, since the semiconductor-type planarization layer 103A is formed by a solution process advantageous for production on a large scale at a low price, a production cost of the OLED or OPV may be reduced by using the integrated conductive substrate 100 of FIG. 1.

The semiconductor material included in the semiconductor-type planarization layer 103A may be, but is not limited to, at least one selected from $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$), molybdenum oxide ($MoO_3$ or $MoO_x$), copper (II) Oxide (CuO), nickel oxide (NiO), copper aluminum oxide (CAO; $CuAlO_2$), zinc rhodium oxide (ZRO; $ZnRh_2O_4$), iron oxide, chromium oxide, bismuth oxide, indium-Gallium Zinc Oxide (IGZO) and $ZrO_2$.

The semiconductor material may be selected from materials having no reactivity to an air or moisture such as semiconductor materials having excellent transparency in a visible region.

The semiconductor material may be $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$), molybdenum oxide ($MoO_3$ or $MoO_x$), iron oxide, chromium oxide, bismuth oxide, indium-gallium zinc oxide (IGZO) or $ZrO_2$, and the material has an N-type semiconductor characteristic, resulting in an excellent electron injection capability. Accordingly, the integrated conductive substrate 100 may have an excellent electron injection characteristic.

In another example, the semiconductor material may be nickel oxide (NiO), copper (II) oxide (CuO), copper aluminum oxide (CAO; $CuAlO_2$), zinc rhodium oxide (ZRO; $ZnRh_2O_4$), and the material has a P-type semiconductor characteristic, resulting in an excellent hole transport capability.

Accordingly, the integrated conductive substrate 100 may have an excellent hole injection characteristic. In addition, since an N-type semiconductor such as tin oxide ($SnO_2$), zinc oxide (ZnO), zinc tin oxide, tungsten oxide ($WO_3$), vanadium oxide ($V_2O_5$, $VO_2$, $V_4O_7$, $V_5O_9$ or $V_2O_3$) or molybdenum oxide ($MoO_3$ or $MoO_x$) has a high workfunction, the integrated conductive substrate 100 using the same can be used as a hole injection electrode.

The semiconductor layer 103 may have a thickness of 5 to 300 nm, for example, 20 to 100 nm, but the present invention is not limited thereto. As the thickness of the semiconductor layer 103 satisfies the above range, the first surface 101S of the metal layer 101 may be effectively planarized and flexibility of the integrated conductive substrate 100 may be maintained.

The integrated conductive substrate 100 simultaneously serves as a substrate and an electrode. Accordingly, when the integrated conductive substrate 100 is used as a substrate and electrode of the OLED or OPV, the organic layer (for example, an electron-injection interfacial layer, an emitting layer or a hole injection layer) of the OLED or OPV may be directly formed on the semiconductor layer 103 of the integrated conductive substrate 100.

Meanwhile, when the integrated conductive substrate 100 is employed in an electronic device, a bottom surface of the metal layer 101, that is, an opposite surface of the first surface 101S of the metal layer 101, of the integrated conductive substrate 100 is in contact with an external air.

Accordingly, the integrated conductive substrate 100 is different from a metal layer and a conductive oxide which are formed on a glass substrate to serve only as an electrode, not to serve as a substrate, and a multilayer structure in which a metal foil is used as a substrate, an insulating planarization layer (or an insulating buffer layer) is formed on the metal foil, and an electrode is formed on the insulating planarization layer.

An exemplary embodiment of a method of manufacturing the integrated conductive substrate 100 is as follows:

First, a metal layer 101 is prepared. As the metal layer 101, a commercially available metal foil (for example, a copper foil) whose surface is treated by a polishing process (for example, a polishing process performed once or twice) requiring the minimum cost may be used.

Subsequently, a semiconductor-type planarization layer 103A, that is, a semiconductor layer 103, is formed on a first surface 101S of the metal layer 101 by providing a first mixture including at least one of a semiconductor material and a precursor of the semiconductor material and a solvent and removing the solvent so as to planarize the first surface 101S of the metal layer 101.

An example of the semiconductor material refers to as described above.

When the first mixture includes a semiconductor material, for example, a nanoparticle of the semiconductor material may be included. The nanoparticle may have an average particle size of 1 to 100 nm.

When the first mixture includes a precursor of the semiconductor material, the precursor of the semiconductor material may be selected from optional materials that can be converted into a semiconductor material in a process of removing a solvent from the first mixture (for example, a thermal treatment process).

For example, the precursor of the semiconductor material may be a sol-gel precursor.

When the first mixture includes a sol-gel precursor of a semiconductor material, and the semiconductor material is a metal oxide, the sol-gel precursor may be selected from the metal oxide and a salt including a metal of the metal oxide (for example, a metal halide, a metal sulfate or a metal perchlorate).

For example, when the semiconductor planarization layer 103A includes ZnO, the first mixture may include, but is not limited to, at least one selected from zinc oxide, zinc sulfate, zinc fluoride, zinc chloride, zinc bromide, zinc iodide, zinc perchlorate, zinc hydroxide ($Zn(OH)_2$), zinc acetate ($Zn(CH_3COO)_2$), zinc acetate hydrate ($Zn(CH_3COO)_2.nH_2O$), diethyl zinc ($Zn(CH_3CH_2)_2$), zinc nitrate ($Zn(NO_3)_2$), zinc nitrate hydrate ($Zn(NO_3)_2.nH_2O$), zinc carbonate ($Zn(CO_3)$), zinc acetylacetonate ($Zn(CH_3COCHCOCH_3)_2$), and zinc acetylacetonate hydrate ($Zn(CH_3COCHCOCH_3)_2.nH_2O$) as a ZnO precursor.

As another example, when the semiconductor-type planarization layer 103A includes indium oxide, the first mixture may include, but is not limited to, at least one of zinc nitrate hydrate ($In(NO_3)_3.nH_2O$), indium acetate ($In(CH_3COO)_2$), indium acetate hydrate ($In(CH_3COO)_2.nH_2O$), indium chloride ($InCl$, $InCl_2$, $InCl_3$), indium nitrate ($In(NO_3)_3$), indium nitrate hydrate ($In(NO_3)_3.nH_2O$), indium acetylacetonate ($In(CH_3COCHCOCH_3)_2$) and indium acetylacetonate hydrate ($In(CH_3COCHCOCH_3)_2.nH_2O$) as an indium oxide precursor.

In still another example, when the semiconductor-type planarization layer 103A includes tin oxide, the first mixture may include, but is not limited to, at least one selected from tin acetate ($Sn(CH_3COO)_2$), tin acetate hydrate ($Sn(CH_3COO)_2.nH_2O$), tin chloride ($SnCl_2$, $SnCl_4$), tin chloride hydrate ($SnCl_n.nH_2O$), tin acetylacetonate ($Sn(CH_3COCHCOCH_3)_2$) and tin acetylacetonate hydrate ($Sn(CH_3COCHCOCH_3)_2.nH_2O$) as a tin oxide precursor.

In yet another example, when the semiconductor-type planarization layer 103A includes gallium oxide, the first mixture may include, but is not limited to, at least one selected from gallium nitrate ($Ga(NO_3)_3$), gallium nitrate hydrate ($Ga(NO_3)_3.nH_2O$), gallium acetylacetonate ($Ga(CH_3COCHCOCH_3)_3$), gallium acetylacetonate hydrate ($Ga(CH_3COCHCOCH_3)_3.nH_2O$) and gallium chloride ($Ga_2Cl_4$, $GaCl_3$) as a gallium oxide precursor.

In yet another example, when the semiconductor-type planarization layer 103A includes tungsten oxide, the first mixture may include, but is not limited to, at least one selected from tungsten carbide (WC), tungstic acid powder ($H_2WO_4$), tungsten chloride ($WCl_4$ or $WCl_6$), tungsten isopropoxide ($W(OCH(CH_3)_2)_6$), sodium tungstate ($Na_2WO_4$), sodium tungstate hydrate ($Na_2WO_4.nH_2O$), ammonium tungstate (($NH_4)_6H_2W_{12}O_{40}$), ammonium tungstate hydrate (($NH_4)_6H_2W_{12}O_{40}.nH_2O$) and tungsten ethoxide ($W(OC_2H_5)_6$) as a tungsten oxide precursor.

In yet another example, when the semiconductor-type planarization layer 103A includes aluminum oxide, the first mixture may include, but is not limited to, at least one selected from aluminum chloride ($AlCl_3$), aluminum nitrate ($Al(NO_3)_3$), aluminum nitrate hydrate ($Al(NO_3)_3.nH_2O$) and aluminum butoxide ($Al(C_2H_5CH(CH_3)O)$) as an aluminum oxide precursor.

In yet another example, when the semiconductor-type planarization layer 103A includes titanium oxide, the first mixture may include, but is not limited to, at least one selected from titanium isopropoxide ($Ti(OCH(CH_3)_2)_4$), titanium chloride ($TiCl_4$), titanium ethoxide ($Ti(OC_2H_5)_4$) and titanium butoxide ($Ti(OC_4H_9)_4$) as a titanium oxide precursor.

In yet another example, when the semiconductor-type planarization layer 103A includes vanadium oxide, the first mixture may include, but is not limited to, at least one selected from vanadium isopropoxide ($VO(OC_3H_7)_3$), ammonium vanadate ($NH_4VO_3$), vanadium acetylacetonate ($V(CH_3COCHCOCH_3)_3$) and vanadium acetylacetonate hydrate ($V(CH_3COCHCOCH_3)_3.nH_2O$) as a vanadium oxide precursor.

In yet another example, when the semiconductor-type planarization layer 103A includes molybdenum oxide, the first mixture may include, but is not limited to, at least one selected from molybdenum isopropoxide ($Mo(OC_3H_7)_5$), molybdenum chloride isopropoxide ($MoCl_3(OC_3H_7)_2$), ammonium molybdate (($NH_4)_2MoO_4$) and ammonium molybdate hydrate (($NH_4)_2MoO_4.nH_2O$) as a molybdenum oxide precursor.

In yet another example, when the semiconductor-type planarization layer 103A includes copper oxide, the first mixture may include, but is not limited to, at least one selected from copper chloride (CuCl, $CuCl_2$), copper chloride hydrate ($CuCl_2.nH_2O$), copper acetate ($Cu(CO_2CH_3)$, $Cu(CO_2CH_3)_2$), copper acetate hydrate ($Cu(CO_2CH_3)_2.nH_2O$), copper acetylacetonate ($Cu(C_5H_7O_2)_2$), copper nitrate ($Cu(NO_3)_2$), copper nitrate hydrate ($Cu(NO_3)_2.nH_2O$), copper bromide (CuBr, $CuBr_2$), copper carbonate ($CuCO_3.Cu(OH)_2$), copper sulfide ($Cu_2S$ or CuS), copper phthalocyanine ($C_{32}H_{16}N_8Cu$), copper trifluoroacetate ($Cu(CO_2CF_3)_2$), copper isobutyrate ($C_8H_{14}CuO_4$), copperethylacetoacetate ($C_{12}H_{18}CuO_6$), copper(II)-ethylhexanoate ($[CH_3(CH_2)_3CH(C_2H_5)CO_2]_2Cu$), copper fluoride ($CuF_2$), copper formate hydrate (($HCO_2)_2Cu.nH_2O$), copper gluconate ($C_{12}H_{22}CuO_{14}$), copper hexafluoroacetylacetonate ($Cu(C_5HF_6O_2)_2$), copper hexafluoroacetylacetonate hydrate ($Cu(C_5HF_6O_2)_2.6H_2O$), copper methoxide ($Cu(OCH_3)_2$), copper neodecanoate ($C_{10}H_{19}O_2Cu$), copper perchlorate hydrate ($Cu(ClO_4)_2.6H_2O$), copper sulfate ($CuSO_4$), copper sulfate hydrate ($CuSO_4.nH_2O$), copper tartaric acid hydrate ($[^-CH(OH)CO_2]_2Cu.nH_2O$), copper trifluoroacetylacetonate ($Cu(C_5H_4F_3O_2)_2$), copper trifluoromethanesulfonate ($(CF_3SO_3)_2Cu$) and tetraamine copper sulfate hydrate ($Cu(NH_3)_4SO_4.H_2O$) as a copper oxide precursor.

In yet another example, when the semiconductor-type planarization layer 103A includes nickel oxide, the first mixture may include, but is not limited to, at least one selected from nickel chloride ($NiCl_2$), nickel chloride hydrate ($NiCl_2.nH_2O$), nickel acetate hydrate ($Ni(OCOCH_3)_2.4H_2O$), nickel nitrate hydrate ($Ni(NO_3)_2.6H_2O$), nickel acetylacetonate ($Ni(C_5H_7O_2)_2$), nickel hydroxide ($Ni(OH)_2$), nickel phthalocyanine ($C_{32}H_{16}N_8Ni$) and nickel carbonate hydrate ($NiCO_3.2Ni(OH)_2.nH_2O$) as a nickel oxide precursor.

In yet another example, when the semiconductor-type planarization layer 103A includes iron oxide, the first mixture may include, but is not limited to, at least one selected from iron acetate ($Fe(CO_2CH_3)_2$), iron chloride ($FeCl_2$ or $FeCl_3$), iron chloride hydrate ($FeCl_3.nH_2O$), iron acetylacetonate ($Fe(C_5H_7O_2)_3$), iron nitrate hydrate ($Fe(NO_3)_3.9H_2O$), iron phthalocyanine ($C_{32}H_{16}FeN_8$) and iron oxalate hydrate ($Fe(C_2O_4).nH_2O$, $Fe_2(C_2O_4)_3.6H_2O$) as an iron oxide precursor.

In yet another example, when the semiconductor-type planarization layer 103A includes chromium oxide, the first mixture may include, but is not limited to, at least one selected from chromium chloride ($CrCl_2$ or $CrCl_3$), chromium chloride hydrate ($CrCl_3.nH_2O$), chromium carbide ($Cr_3C_2$), chromium acetylacetonate ($Cr(C_5H_7O_2)_3$), chromium nitrate hydrate ($Cr(NO_3)_3.nH_2O$), chromium hydroxide acetate ($(CH_3CO_2)_7Cr_3(OH)_2$) and chromium acetate hydrate ($[(CH_3CO_2)_2Cr.H_2O]_2$) as a chromium oxide precursor.

In yet another example, when the semiconductor-type planarization layer 103A includes bismuth oxide, the first mixture may include, but is not limited to, at least one selected from bismuth chloride ($BiCl_3$), bismuth nitrate hydrate ($Bi(NO_3)_3.nH_2O$), bismuth acetate ($(CH_3CO_2)_3Bi$) and bismuth carbonate ($(BiO)_2CO_3$) as a bismuth oxide precursor.

The solvent in the first mixture may be selected from optional solvents which have miscibility with a semiconductor material and/or a precursor of the semiconductor material, and is easily removed by a thermal treatment process.

As the solvent of the first mixture, both of a polar solvent and a non-polar solvent may be used. For example, as the polar solvent, an alcohol or a ketone may be used, and as the non-polar solvent, an aromatic hydrocarbon-, alicyclic hydrocarbon-, or aliphatic hydrocarbon-based organic solvent may be used. The solvent of the first mixture may be, but is not limited to, at least one selected from ethanol, dimethylformamide, ethanol, methanol, propanol, butanol, isopropanol, methylethylketone, propyleneglycol (mono)methylether (PGM), isopropylcellulose (IPC), methylcellosolve (MC), ethylene carbonate (EC), methylcellosolve, ethylcellosolve, 2-methoxy ethanol and ethanol amine.

For example, when a semiconductor-type planarization layer 103A formed of ZnO is formed, the first mixture provided to the first surface 101S of the metal layer 101 may include zinc acetate dehydrate as a precursor of a semiconductor material, and a combination of 2-methoxy ethanol and ethanol amine as a solvent, but the present invention is not limited thereto.

A method of providing the first mixture on the first surface 101S of the metal layer 101 may be selected from known coating methods, for example, a spin coating method, a casting method, a Langmuir-Blodgett (LB) method, a spray coating method, a dip coating, method, a gravure coating method, a reverse off-set coating method, a screen printing method, a slot-die coating method, a nozzle printing method, and a dry transfer printing method, but the present invention is not limited thereto.

To remove the solvent from the first mixture provided on the first surface 101S of the metal layer 101, a thermal treatment process may be used, and the thermal treatment condition may vary according to the type and content of the selected solvent, but may be selected at 100 to 350° C. for 0.1 to 1 hour.

Figure 2:
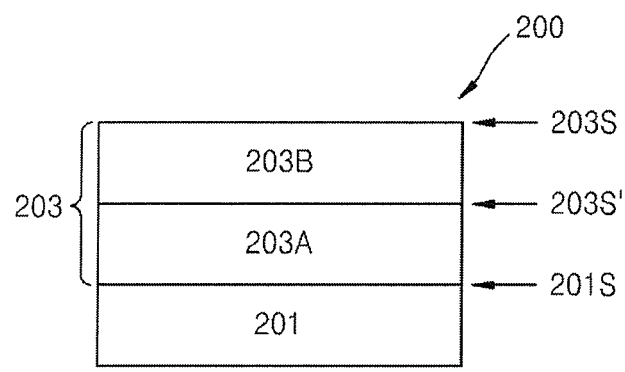
FIG. 2 is a schematic diagram of an integrated conductive substrate according to an another exemplary embodiment.

FIG. 2 is a schematic diagram of a cross-section of an integrated conductive substrate 200 according to another exemplary embodiment.

The integrated conductive substrate 200 of FIG. 2 includes a metal layer 201 and a semiconductor layer 203, and the semiconductor layer 203 includes a semiconductor-type planarization layer 203A formed by a solution process and an intermediate layer 203B formed by a deposition method. The semiconductor-type planarization layer 203A is in contact with a first surface 201S of the metal layer 201, and the intermediate layer 203B is formed on the semiconductor-type planarization layer 203A.

Descriptions for the metal layer 201 of FIG. 2 refer to the descriptions for the metal layer 101 of FIG. 1. The first surface 201S of the metal layer 201 of FIG. 2 may have a first root mean square roughness (Rq) of 10 nm or more, like the first root mean square roughness (Rq) of the first surface 101S of the metal layer 101 of FIG. 1.

Descriptions for the semiconductor-type planarization layer 203A of FIG. 2 refer to the descriptions for the semiconductor-type planarization layer 103A of FIG. 1. The semiconductor-type planarization layer 203A is formed by a solution process, and therefore a morphology of a surface 203S' of the semiconductor-type planarization layer 203A does not follow a morphology of the first surface 201S of the metal layer 201. Accordingly, the surface 203S' of the semiconductor-type planarization layer 203A may have a root mean square roughness (Rq) lower than the first surface 201S of the metal layer 201. For example, the root mean square roughness (Rq) of the surface 203S' of the semiconductor-type planarization layer 203A may be less than 10 nm.

The intermediate layer 203B is formed on the semiconductor-type planarization layer 203A by a deposition method. The intermediate layer 203B may serve to increase conductivity and a charge extraction characteristic of the integrated conductive substrate 200 of FIG. 2.

Conditions for forming the intermediate layer 203B may vary according to a compound to be deposited, but may be selected, for example, in ranges of a deposition temperature of 25 to 1500° C., a vacuum degree of $10^{-10}$ to $10^{-3}$ torr, and a deposition speed of 0.01 to 100 Å/sec.

A thickness of the intermediate layer 203B may be, but is not limited to, 5 to 200 nm, for example, 20 to 50 nm. When the thickness of the intermediate layer 203B satisfies the above range, a flexible inverted OLED which facilitates electron injection and transport and maintains flexibility may be realized.

The intermediate layer 203B may include a semiconductor material. An exemplary example of the semiconductor material which may be included in the intermediate layer 203B refers to an example of the semiconductor material which may be included in the semiconductor-type planarization layer 103A, that is, the semiconductor layer 103 of FIG. 1.

The semiconductor material included in the semiconductor-type planarization layer 203A may be the same as or different from that included in the intermediate layer 203B. According to an exemplary embodiment, the semiconductor material included in the semiconductor-type planarization layer 203A may be the same as or different from that included in the intermediate layer 203B, but the present invention is not limited thereto.

Although the intermediate layer 203B is formed by a deposition method, since the surface 203S' of the semiconductor-type planarization layer 203A under the intermediate layer 203B has a smaller root mean square roughness (Rq) due to the same reason as described above, a second root mean square roughness (Rq) of a surface of the intermediate layer 203B, that is, a second surface 203S of the semiconductor layer 203, may have a root mean square roughness (Rq) that the surface 203S' of the semiconductor-type planarization layer 203A has.

For example, the second root mean square roughness (Rq) of the second surface 203S of the semiconductor layer 203 of FIG. 2 may be less than 10 nm. Accordingly, although an organic layer (for example, an electron-injection interfacial layer, an emitting layer or a hole injection layer) of the OLED or OPV is directly formed on the second surface 203S of the semiconductor layer 203, an electrical failure such as an electrical short does not occur, and therefore a high quality OLED or OPV may be realized by using the integrated conductive substrate 200.

The thickness range of the semiconductor layer 203 of FIG. 2 refers to a thickness range of the semiconductor layer 103 of FIG. 1.

Figure 3:
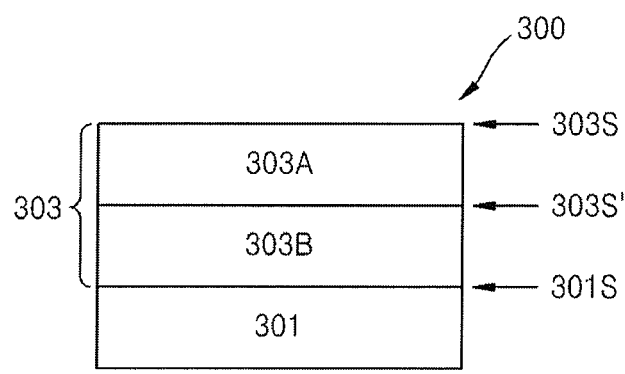
FIG. 3 is a schematic diagram of an integrated conductive substrate according to a still another exemplary embodiment.

FIG. 3 is a schematic diagram of a cross-section of an integrated conductive substrate 300 according to an exemplary embodiment.

The integrated conductive substrate 300 of FIG. 3 includes a metal layer 301 and a semiconductor layer 303, and the semiconductor layer 303 includes an intermediate layer 303B formed by a deposition method and a semiconductor-type planarization layer 303A formed by a solution process. The intermediate layer 303B is interposed between the metal layer 301 and the semiconductor-type planarization layer 303A.

Descriptions for the metal layer 301 of FIG. 3 refer to the descriptions for the metal layer 101 of FIG. 1. A first root mean square roughness (Rq) of a first surface 301S of the metal layer 301 of FIG. 3 may be 10 nm or more, like the first root mean square roughness (Rq) of the first surface 101S of the metal layer 101 of FIG. 1.

Descriptions for the intermediate layer 303B of FIG. 3 refer to the descriptions for the intermediate layer 203B of FIG. 2. However, since a morphology of a surface 303S' of the intermediate layer 303B of FIG. 3 follows a morphology of the first surface 301S of the underlying metal layer 301, unlike the surface 203S of the intermediate layer 203B of FIG. 2, a root mean square roughness (Rq) of the surface 303S' of the intermediate layer 303B may be 10 nm or more.

Descriptions for the semiconductor-type planarization layer 303A of FIG. 3 refer to the descriptions for the semiconductor-type planarization layer 103A of FIG. 1. Since the semiconductor-type planarization layer 303A is formed by a solution process, a morphology of a second surface 303S of the semiconductor-type planarization layer 303A does not follow the morphology of the surface 303S' of the intermediate layer 303B. Accordingly, a second root mean square roughness (Rq) of a surface of the semiconductor-type planarization layer 303A, that is, the second surface 303S of the semiconductor layer 303, is smaller than a first root mean square roughness (Rq) of the first surface 301S of the metal layer 301. For example, a root mean square roughness (Rq) of the surface of the semiconductor-type planarization layer 303A, that is, the second surface 303S of the semiconductor layer 303, may be less than 10 nm.

Accordingly, although an organic layer (for example, an electron-injection interfacial layer, an emitting layer or a hole injection layer) of the OLED or OPV is directly formed on the second surface 303S of the semiconductor layer 303, an electrical failure such as an electrical short does not occur, and therefore a high quality electronic device (for example, an OLED or OPV) may be realized by using the integrated conductive substrate 300.

As a result, an electronic device using the above-described integrated conductive substrate 100, 200 or 300 is provided.

The electronic device may be an OLED or OPV.

The organic layer of the OLED or OPV may be formed on the semiconductor layer 103, 203 or 303 of the integrated conductive substrate 100, 200 or 300, and a bottom surface of the metal layer 101, 201 or 301 of the integrated conductive substrate 100, 200 or 300 may be in contact with an external air. Consequently, it is clear that the integrated conductive substrate 100, 200 or 300 simultaneously serves as an electrode and a substrate.

A pixel defining film may be patterned on the second surface 303S of the semiconductor layer 103, 203 or 303 of the integrated conductive substrate 100, 200 or 300.

The pixel defining film may serve to define an actual pixel or a pixel region. In addition, to drive the device after forming a counter electrode of the integrated conductive substrate 100, 200 or 300, an electrode for an electrical interconnection may be further formed in a region other than the pixel, and the pixel defining film provides a position at which the electrode for an electrical interconnection is formed. When an insulating pixel defining film is not formed between the integrated conductive substrate 100, 200 or 300 and the counter electrode, during supply of charges through the integrated conductive substrate 100, 200 or 300 and the counter electrode, a leakage current or an electrical short may occur due to a minute pressure of a measuring or driving probe.

The pixel defining film may be formed using an optional insulating material such as an insulating polymer or an insulating ceramic material.

As the insulating polymer material, a material including a double or triple bond and not having a p-p conjugated structure can be used. For example, at least one of polystyrene, crosslinked epoxy, crosslinked polydimethylsiloxane, polyethylene, a photoresist polymer, poly(methyl meta acrylate) (PMMA), poly(4-vinyl phenol) (PVP), poly(melamine-co-formaldehyde), styrene-butadiene rubber, polyurethane, parylene, perylene and a derivative thereof may be used.

The pixel defining film may further include an initiator, a catalyst, a crosslinking agent, and an additive, in addition to the insulating polymer, but the present invention is not limited thereto.

The pixel defining film including the insulating polymer material may have a thickness of 100 nm to 100 μm, and may be formed by a vacuum deposition method, a spin coating method, a casting method, a Langmuir-Blodgett (LB) method, a spray coating method, a dip coating method, a gravure coating method, a reverse off-set coating method, a screen printing method, a slot-die coating method, a nozzle printing method, or a dry transfer printing method.

An exemplary example of the insulating ceramic material includes a material derived from an inorganic material such as SiO, $SiO_2$, SiNx, $Al_2O_3$ or $HfO_2$ or a sol-gel ceramic precursor (for example, a metal alkoxide such as tetramethoxysilane (TMOS) and/or tetraethyl-orthosilicate (TEOS)), but the present invention is not limited thereto.

The pixel defining film including the insulating ceramic material may have a thickness of 50 nm to 100 μm, and may be formed by thermal deposition, e-beam deposition or atomic-layer deposition (ALD).

Figure 4:
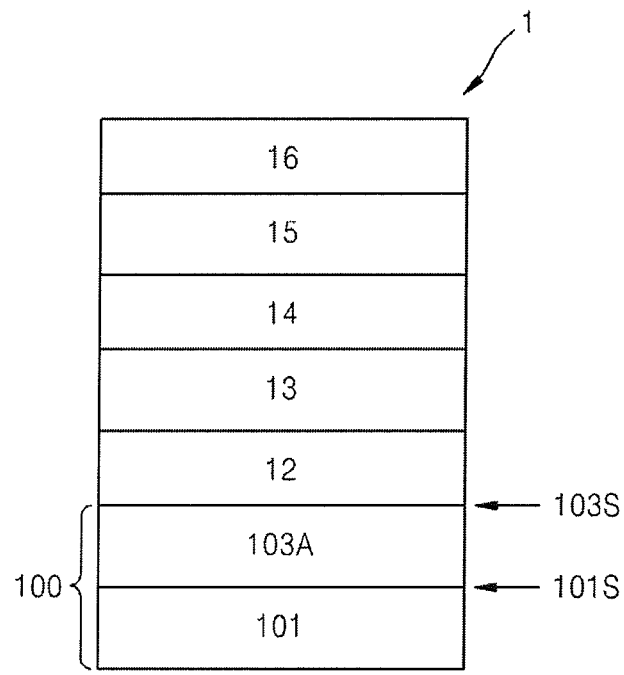
FIG. 4 is a schematic diagram of an OLED according to an exemplary embodiment.

FIG. 4 is a schematic diagram of a cross-section of a flexible inverted OLED 1 according to an exemplary embodiment.

The flexible inverted OLED 1 includes an integrated conductive substrate 100 simultaneously serving as a substrate and a cathode, a transparent anode 15 facing the integrated conductive substrate 100 and an emitting layer 13 interposed between the integrated conductive substrate 100 and the transparent anode 15. An electron-injection interfacial layer 12 is interposed between the integrated conductive substrate 100 and the emitting layer 13. The electron-injection interfacial layer 12 is in contact with the semiconductor-type planarization layer 103A of the integrated conductive substrate 100, that is, the second surface 103S of the semiconductor layer 103. A hole injection layer 14 is interposed between the emitting layer 13 and the transparent anode 15. In addition, an optical matching layer 16 is disposed on the transparent anode 15.

A bottom surface of the metal layer 101 of the integrated conductive substrate 100 of the flexible inverted OLED 1 is in contact with an external air.

Accordingly, the flexible inverted OLED 1 has a structure in which the integrated conductive substrate 100 simultaneously serving as a substrate and a cathode, the electron-injection interfacial layer 12, the emitting layer 13, the hole injection layer 14, the transparent anode 15 and the optical matching layer 16 are sequentially stacked.

Descriptions for the integrated conductive substrate 100 refer to the descriptions for FIG. 1.

Although not shown in FIG. 1, a pixel defining film patterned by pixels may be formed on the semiconductor layer 103 of the integrated conductive substrate 100.

The electron-injection interfacial layer 12 stimulating electron injection in the emitting layer 13 is formed on the semiconductor layer 103A of the integrated conductive substrate 100.

The electron-injection interfacial layer 12 may include at least one of a metal carbonate, a metal azide, a metal fluoride, an ion-containing self-assembled material and a self-assembled material not having a dipolar moment of 0.

A method of forming the electron injection interface layer 12 refers to a method of forming the semiconductor layer 103, 203 or 303 of FIGS. 1 to 3.

The metal carbonate may include at least one selected from $Li_2CO_3$, $Na_2CO_3$, $K_2CO_3$, $Rb_2CO_3$, $Cs_2CO_3$, $MgCO_3$, $CaCO_3$ and $BaCO_3$.

The metal azide may include at least one selected from $CsN_3$, $Li_3N$ and $NaN_3$.

The metal fluoride may include at least one selected from LiF, NaF, KF, $SrF_2$, $CeF_3$, RbF, CsF, $MgF_2$, $CaF_2$, $LaF_3$, $ThF_4$, $BeF_2$ and $BaF_2$.

Examples of the ion-containing self-assembled material and the self-assembled material not having a dipolar moment of 0 may be, but are not limited to, all of materials cited in Abraham Ulman, Chem. Rev. 1996, 96, 1533-1554 including unimolecular materials (e.g, alkanethiol) ending with a —OH, $—NH_2$, —COOH (e.g., n-alkanoic acids ($C_nH_{2n+1}COOH$) or docosanoic acid ($CH_3(CH_2)_{20}$—COOH)) or —SH group, organo silicon materials such as alkylchlorosilanes, alkylalkoxysilanes or alkylaminosilanes ending with a $—SiCl_3$ terminal end group, di-n-alkyl sulfide, di-n-alkyl disulfides, thiophenols, mercaptopyridines, mercaptoanilines, thiophenes, cysteines, xanthates, thiocarbaminates, thiocarbamates, thioureas, mercaptoimidazoles, and alkaneselenols.

The electron-injection interfacial layer 12 may have a thickness of 1 to 10 nm, for example, 3 to 7 nm, but the present invention is not limited thereto. When the thickness of the electron-injection interfacial layer 12 satisfies the above range, an electron injection barrier is reduced due to a change of a work-function of the semiconductor layer 103 of the integrated conductive substrate 100, and therefore the electron-hole separation in the emitting layer 13 is increased. As a result, photo-conversion efficiency of the OLED 1 may be increased.

The emitting layer 13 is formed on the electron-injection interfacial layer 12.

As a material for the emitting layer 13, a low molecule emitting material and/or a high molecule emitting material may be optionally used.

The emitting layer 13 may be formed by a method optionally selected from various known methods such as a vacuum deposition method, a spin coating method, a casting method, a Langmuir-Blodgett (LB) method, a spray coating method, a dip coating method, a gravure coating method, a reverse off-set coating method, a screen printing method, a slot-die coating method, and a nozzle printing method. Here, when the vacuum deposition method is selected, depending on a desired compound, or the structure and thermal characteristic of a desired layer, for example, deposition conditions may be selected within a deposition temperature range of 100 to 500° C., a range of vacuum degree of $10^{-10}$ to $10^{-3}$ torr, and a deposition speed range of 0.01 to 100 □/sec. Meanwhile, when the spin coating method is selected, although different from a desired compound, or the structure and thermal characteristic of the desired layer, coating conditions may be selected within a coating speed range of 2000 to 5000 rpm, and a thermal treatment temperature (thermal treatment temperature for removing a solvent after coating) of 80 to 200° C.

The emitting layer 13 may be formed of a single emitting material, or include a host and a dopant.

As an example of the host, $Alq_3$, 4,4'-N,N'-dicarbazole-biphenyl (CBP), 9,10-di(naphthalene-2-yl)anthracene (ADN), TCTA, TAPC, 1,3,5-tris(N-phenylbenzimidazole-2-yl)benzene (TPBI), 3-tert-butyl-9,10-di(naphth-2-yl)anthracene (TBADN), E3 (refer to the following formula), $BeBq_2$ (refer to the following formula) or a mixture thereof may be used, but the present invention is not limited thereto.

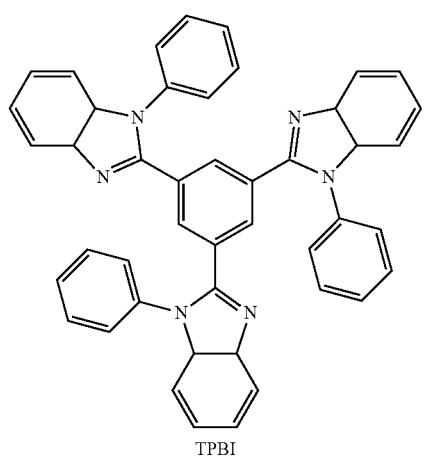
TPBI
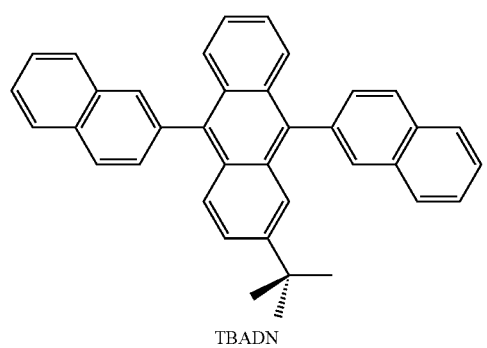
TBADN
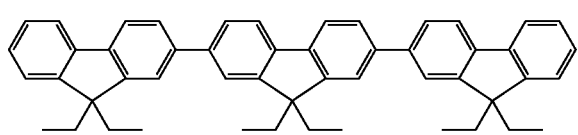
E3
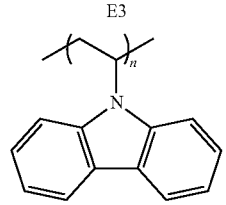
PVK
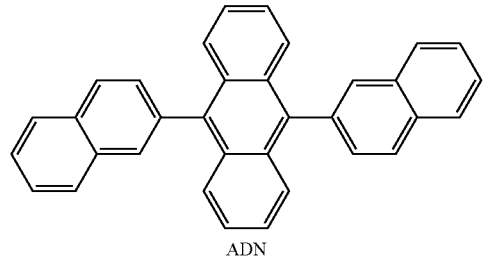
ADN
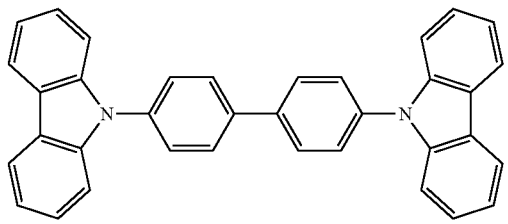
CBP
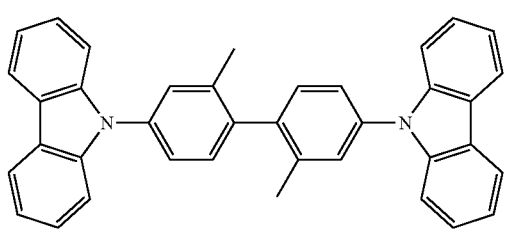
dmCBP
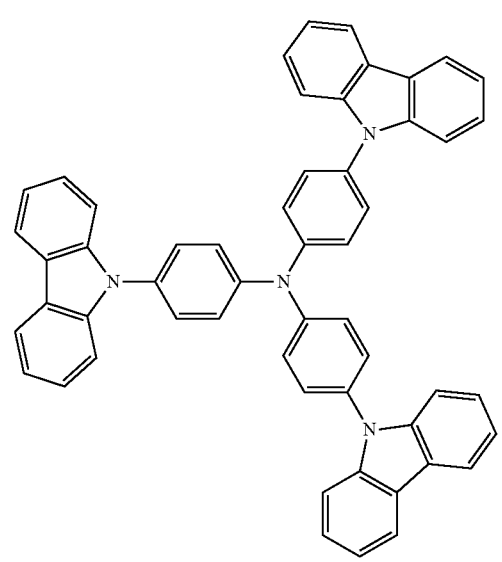
TCTA
Among dopants, as a blue dopant, the following compounds may be used, but the present invention is not limited thereto.

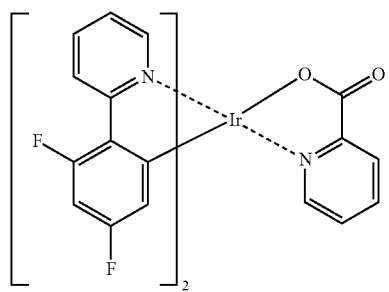
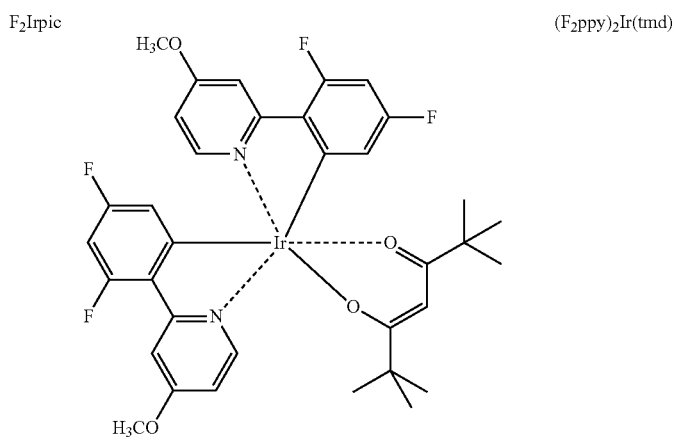
F₂Irpic  (F₂ppy)₂Ir(tmd)
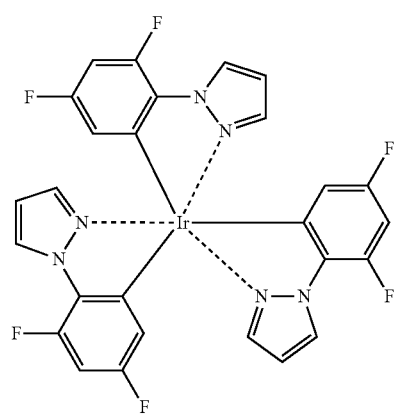
Ir(dfppz)₃
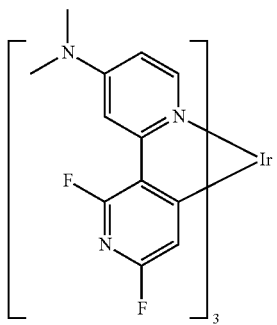
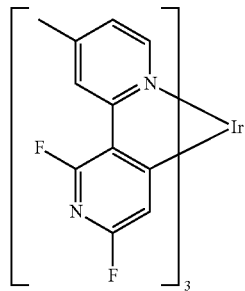
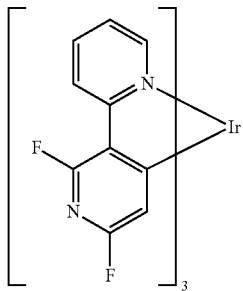
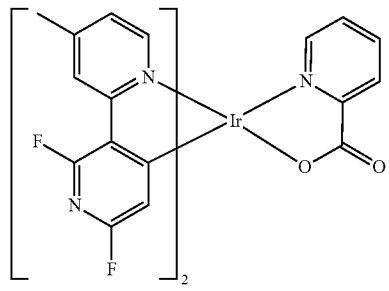
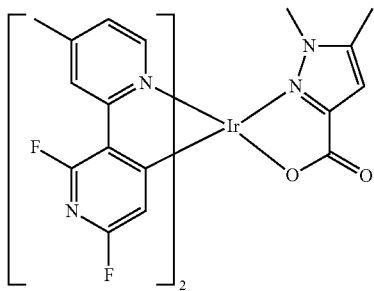

-continued
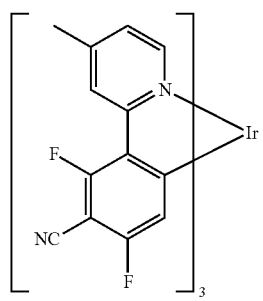
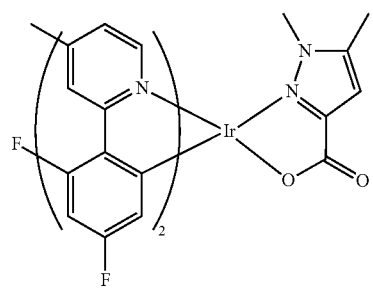
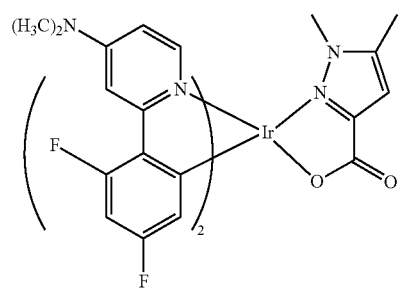
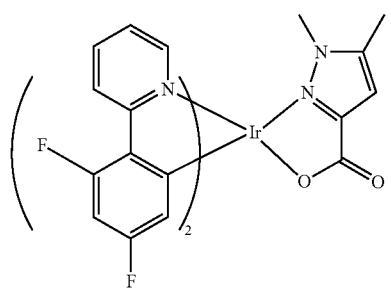
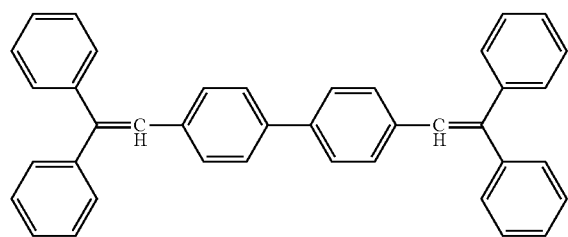
DPVBi
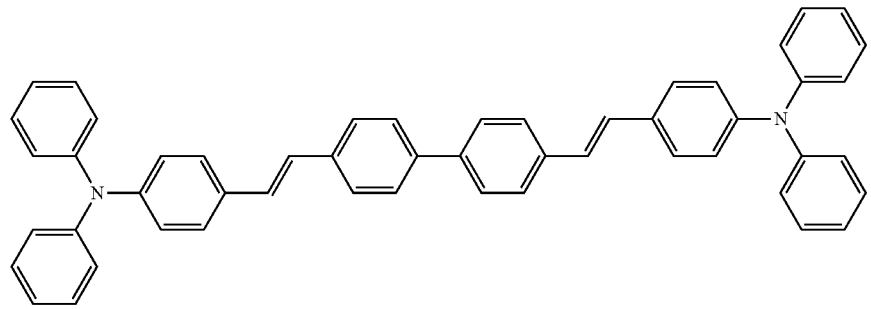
DPAVBi
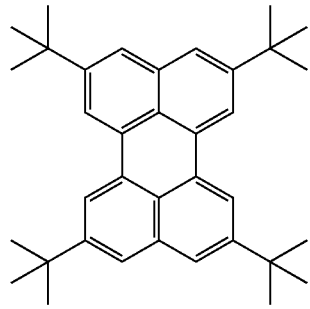
TBPe Among dopants, as a red dopant, the following compounds may be used, but the present invention is not limited thereto. In addition, as the red dopant, DCM or DCJTB which will be described below may be used.
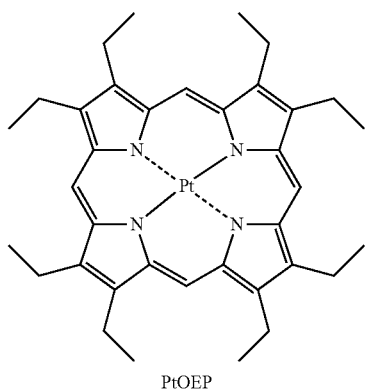
PtOEP
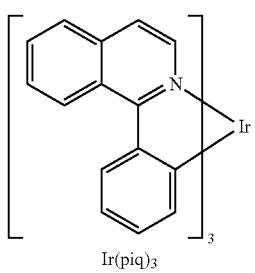
Ir(piq)₃
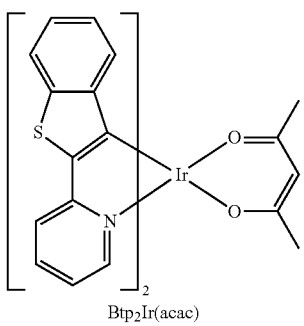
Btp₂Ir(acac)
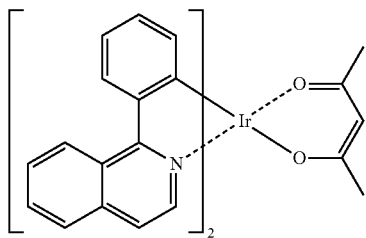
-continued
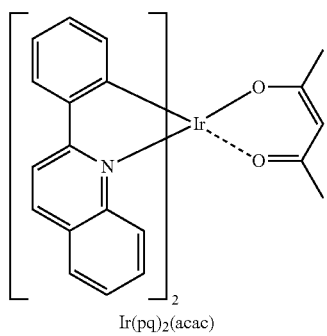
Ir(pq)₂(acac)
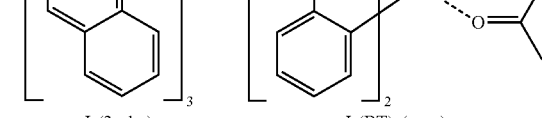
Ir(2-phq)₃     Ir(BT)₂(acac)
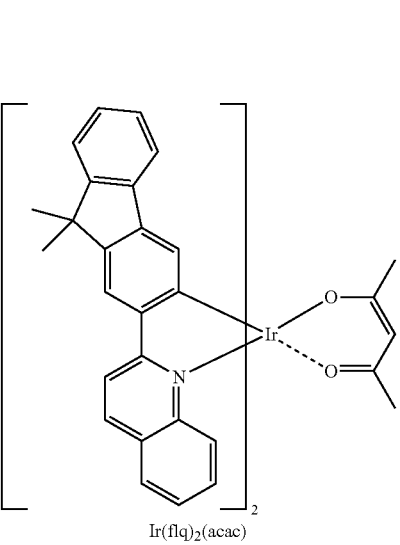
Ir(flq)₂(acac)

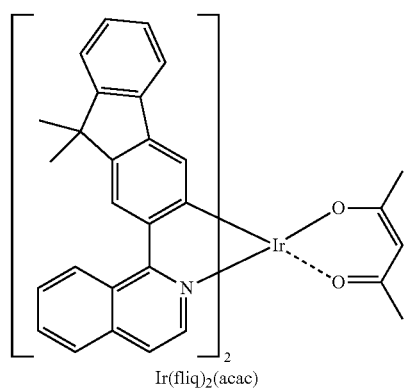

Ir(fliq)₂(acac)

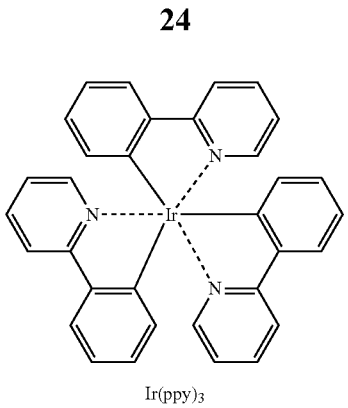

Ir(ppy)₃

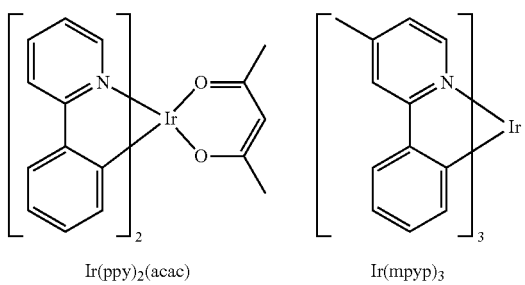

Ir(ppy)₂(acac)    Ir(mpyp)₃

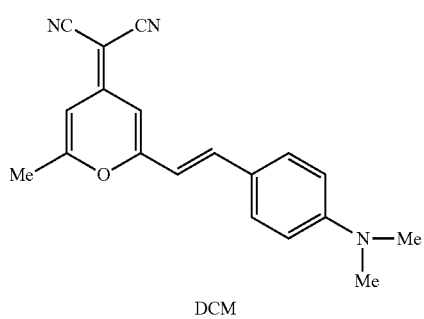

DCM

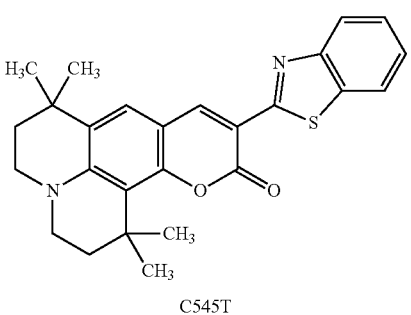

C545T

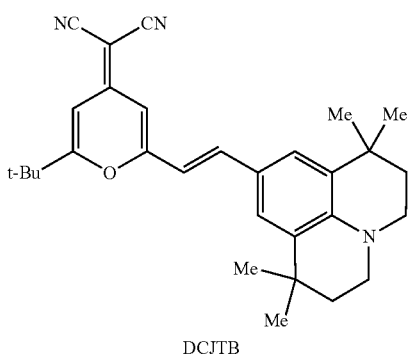

DCJTB

Among dopants, as a green dopant, the following compounds may be used, but the present invention is not limited thereto. In addition, as the green dopant, the following C545T may be used.

Meanwhile, the emitting layer 13 may be a derivative or copolymer of a conjugated polymer such as a polyfluorene, a polyspirofluorene, poly(p-phenylene vinylene), poly(p-phenylene), a polythiophene, or polycarbazole. The emitting layer may include both fluorescence and phosphorescence. In addition, a polymer in which a fluorescent and phosphorescent coloring functional group is grafted to a non-conjugated polymer is possibly used. For example, a polymer represented as one of Formulas 100, 101, 102 and 103 may be included, but the present invention is not limited thereto.

(a)
<Formula 100>
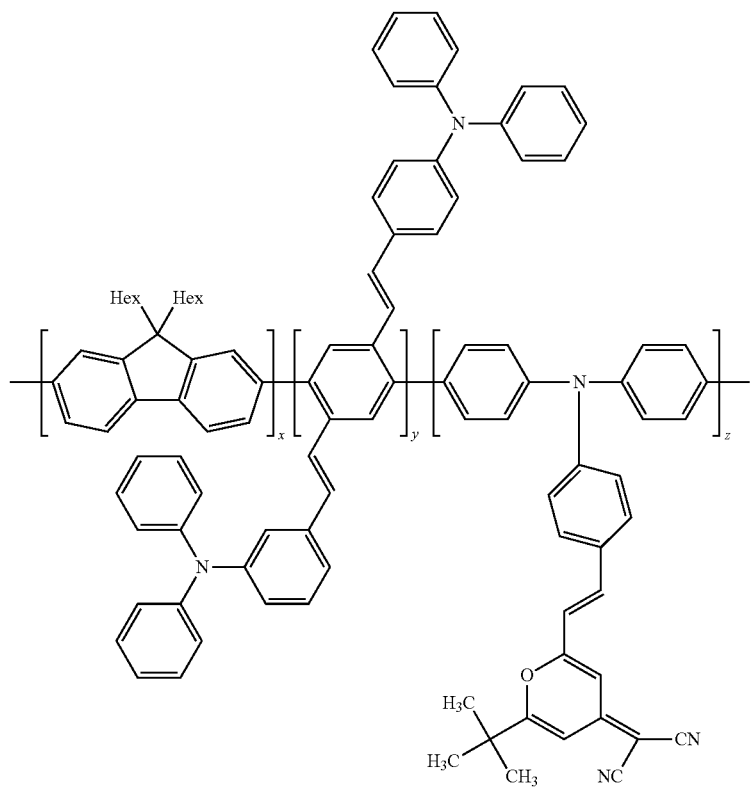
CIE xy (0.33, 0.35)
0.10 cd/A
x = 0.95, y = 0.03, z = 0.02
(b)
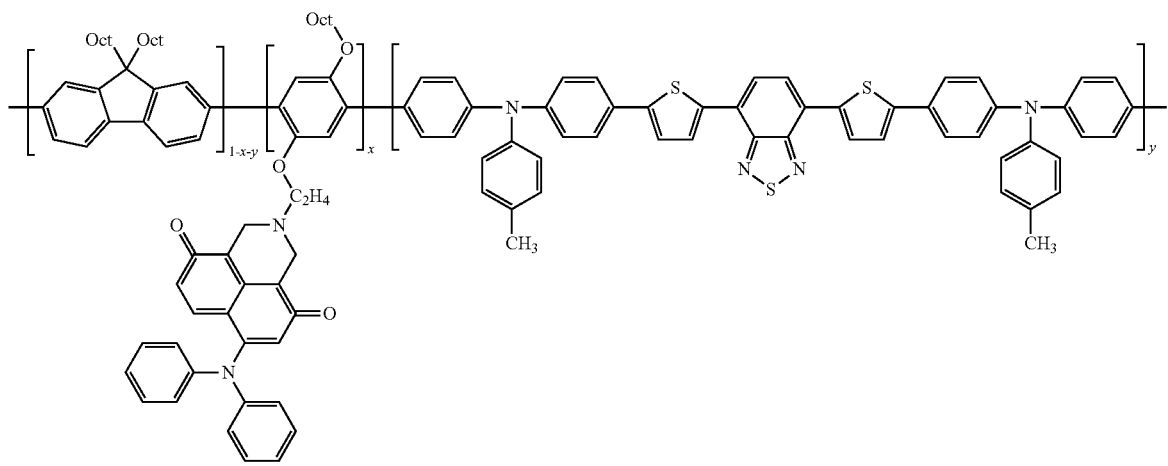
CIE xy (0.31, 0.34)
1.59 cd/A, 0.83 lm/W
x = 0.0002, y = 0.0003

-continued
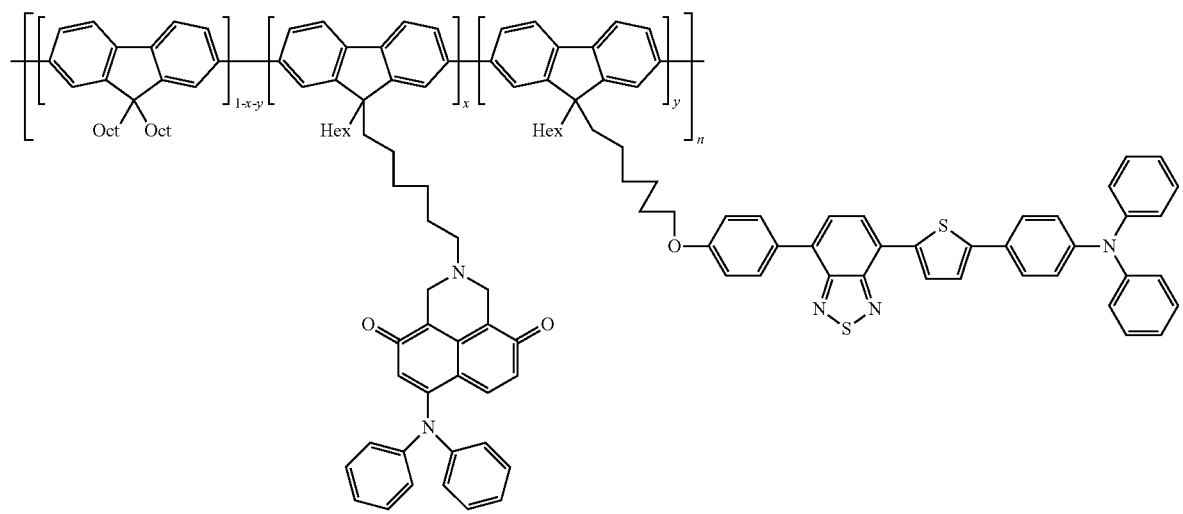
(c)
CIE xy (0.31, 0.32)
7.30 cd/A, 4.17 lm/W
x = 0.0002, y = 0.0002
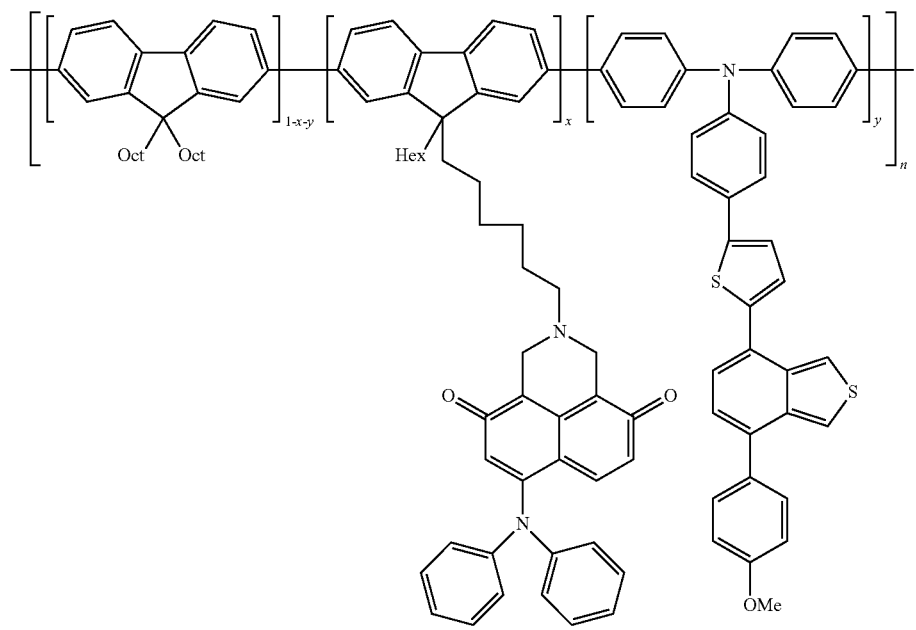
(d)
CIE xy (0.30, 0.31)
3.80 cd/A, 1.99 lm/W
x = 0.0002, y = 0.0002

-continued
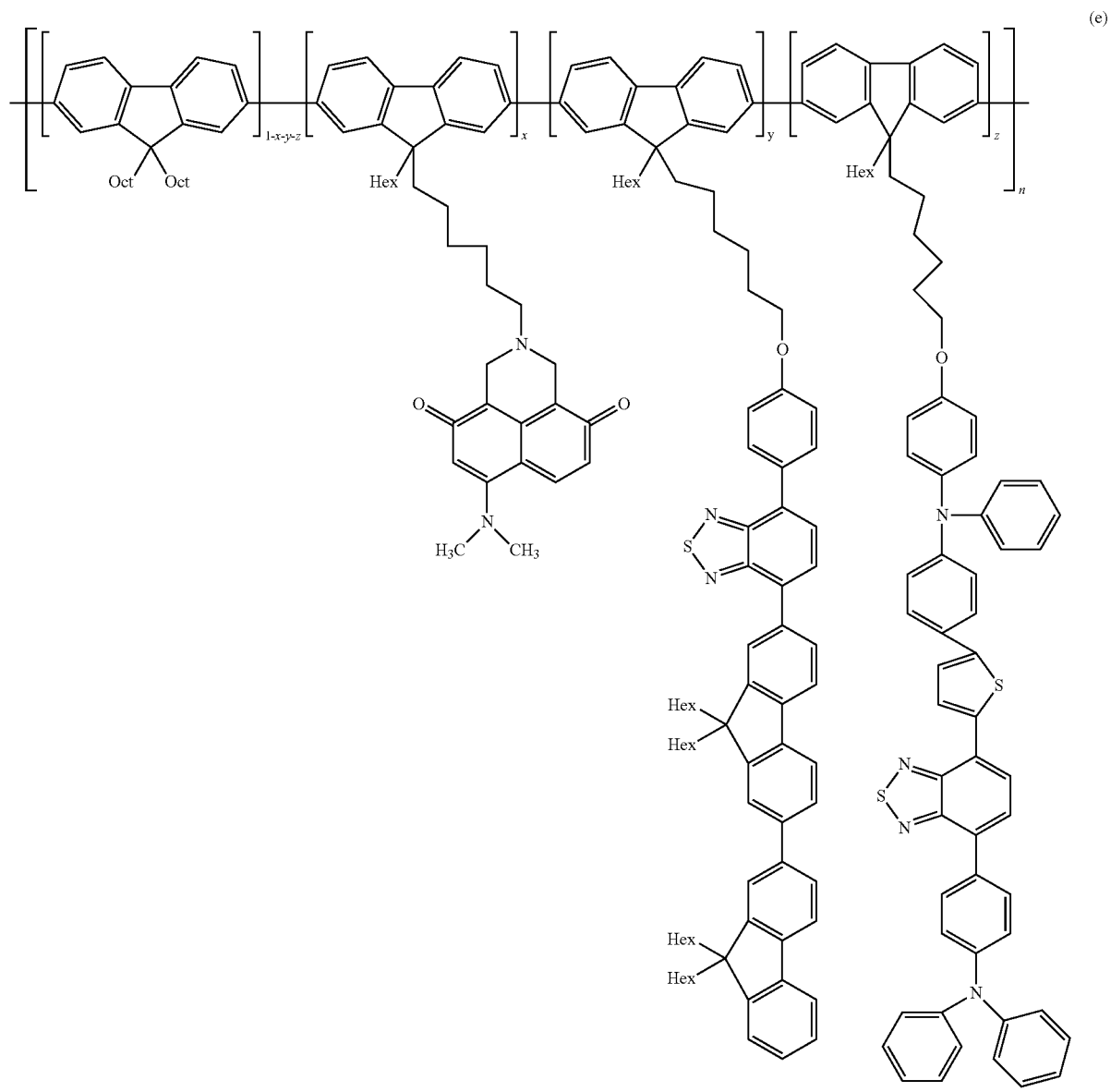
(e)
CIE xy (0.33, 0.36)
8.6 cd/A, 5.4 lm/W
x = 0.0005, y = 0.0005, z = 0.0002

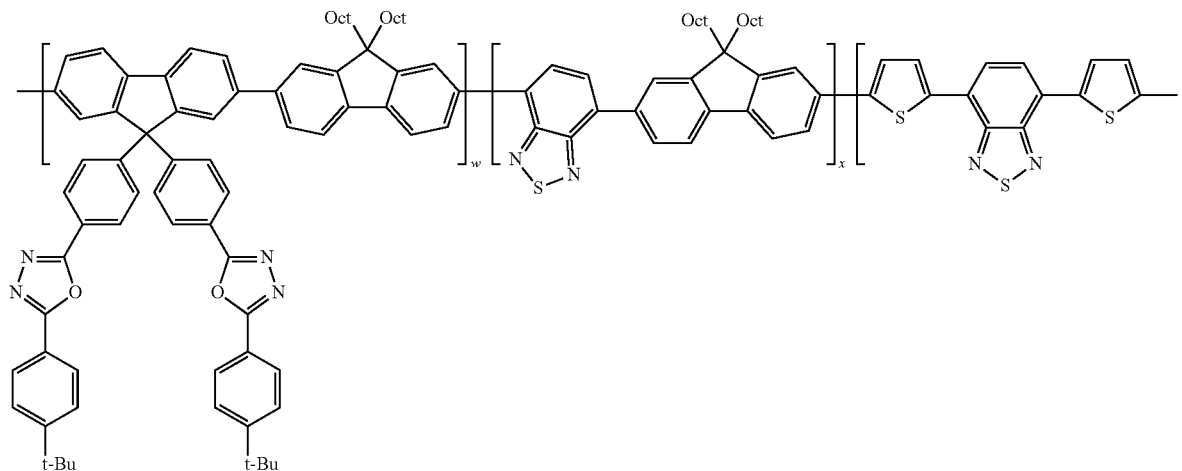
(f)
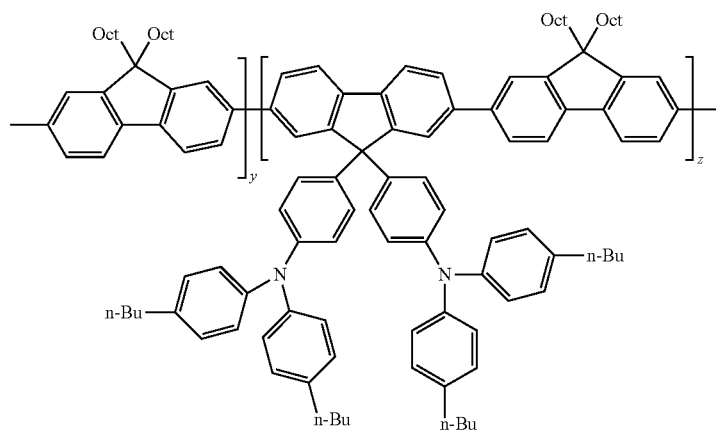
(a)
CIE xy (0.37, 0.36)
4.87 cd/A
w = z = 0.4938n
x = 0.0080n, y = 0.0044n
<Formula 101>
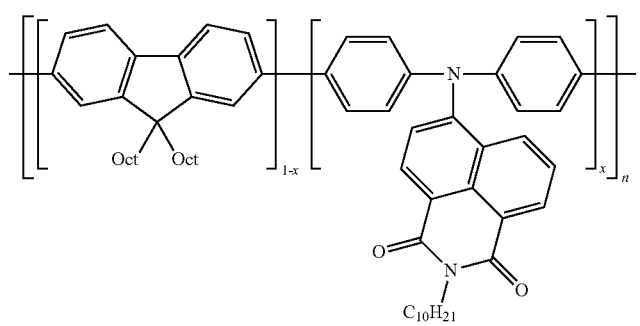
CIE xy (0.25, 0.35)
5.3 cd/A, 2.8 lm/W
x = 0.0005

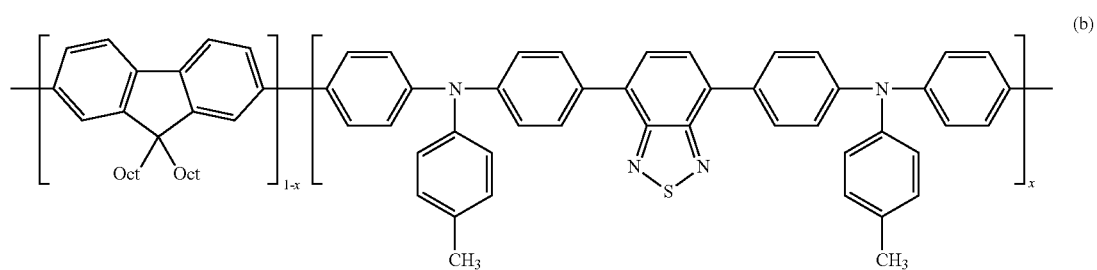
CIE xy (0.35, 0.34)
8.99 cd/A, 5.75 lm/W
x = 0.0003
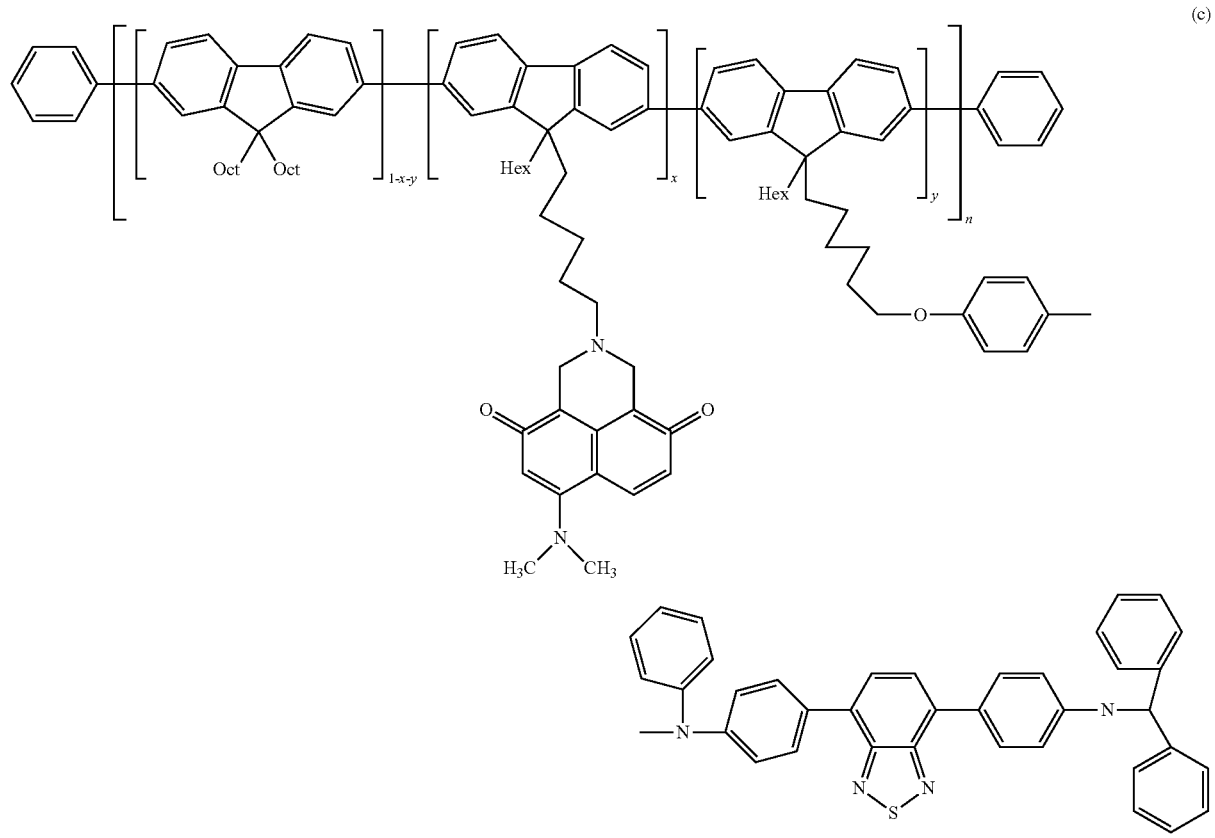
CIE xy (0.31, 0.36)
12.8 cd/A, 8.51 lm/W
x = 0.0005, y = 0.0003
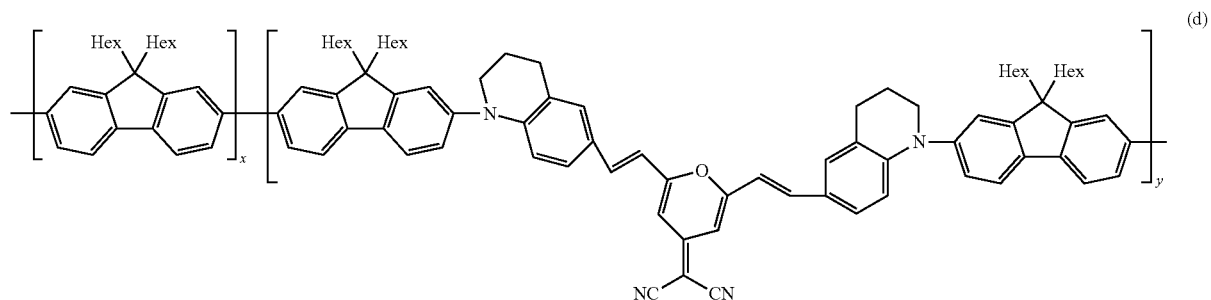
CIE xy (0.33, 0.31)
0.60 cd/A
x = 0.995, y = 0.005

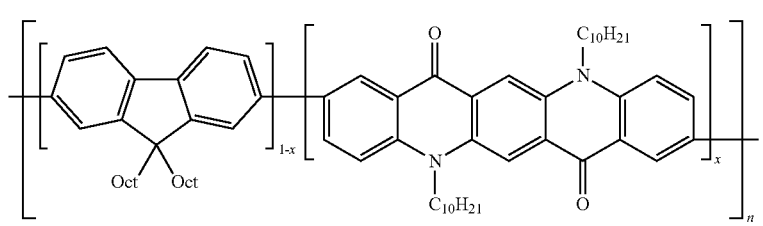
(e)
CIE xy (0.27, 0.35)
3.47 cd/A, 2.18 lm/W
x = 0.0003
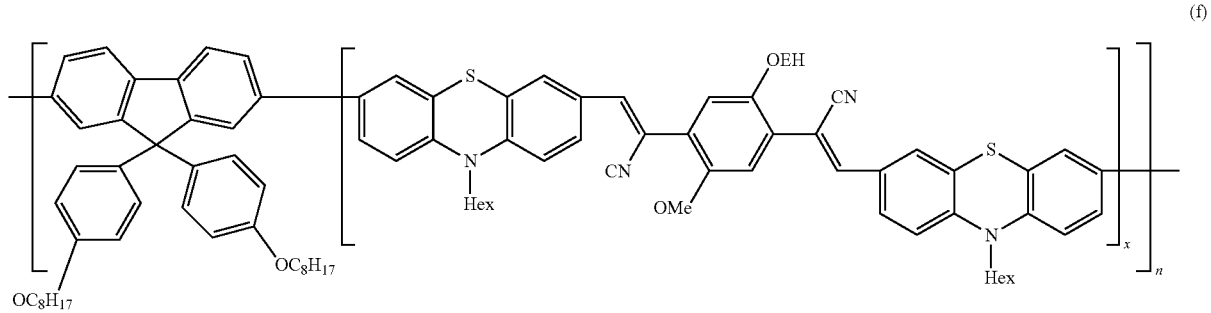
(f)
CIE xy (0.33, .39)
1.95 cd/A, 0.97 lm/W
x = 0.005
<Formula 102>
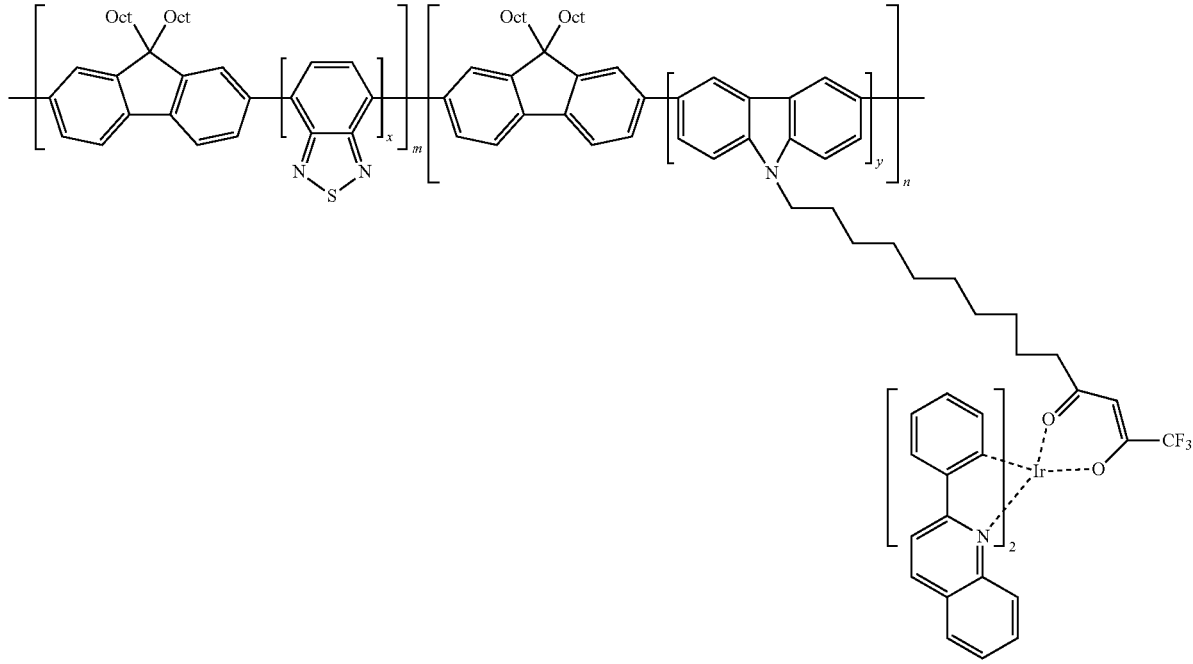
(a)
CIE xy (0.31, 0.36)
4.6 cd/A
x = 0.0003, y = 0.003

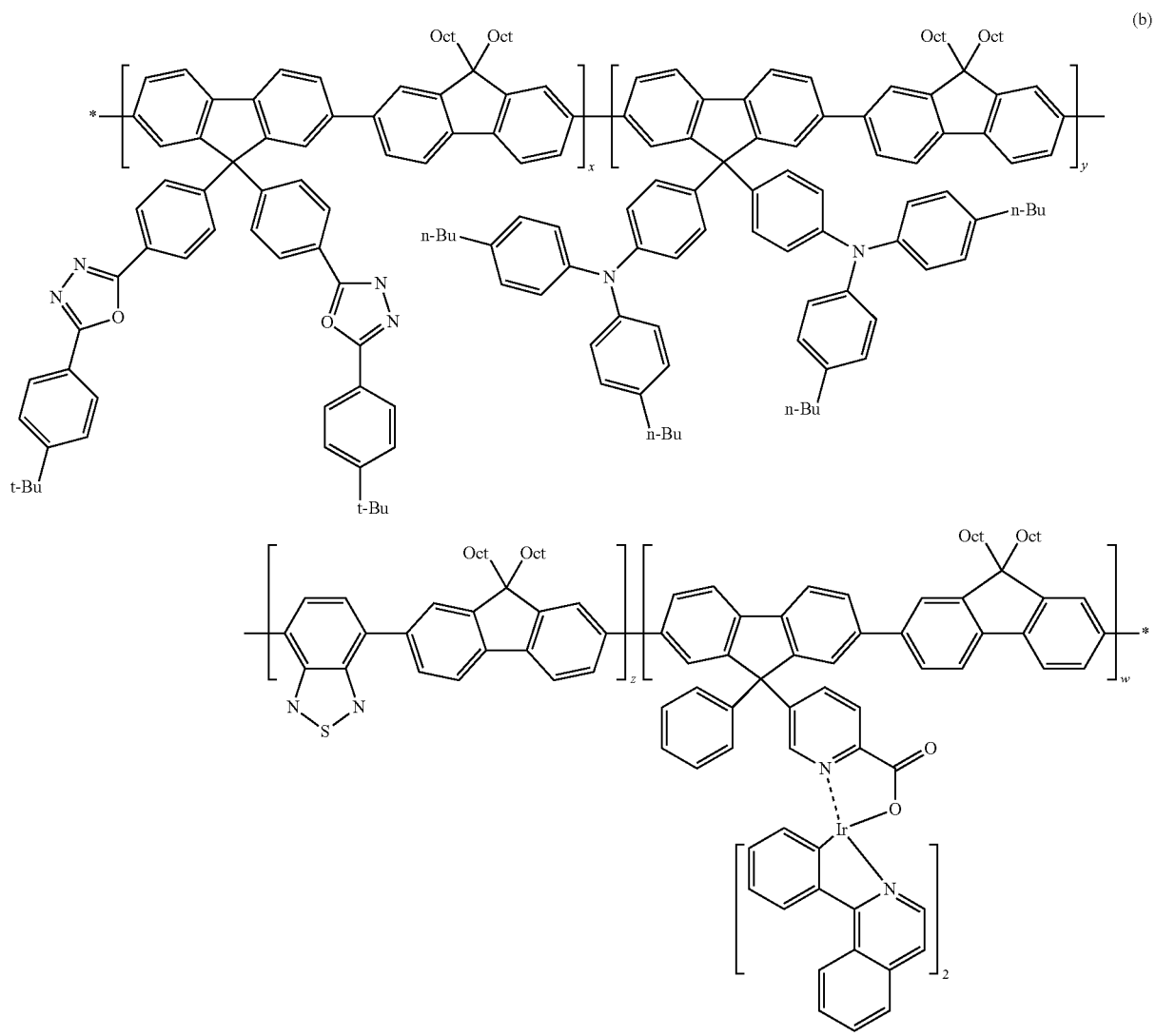
CIE xy (0.35, 0.38)
8.2 cd/A, 7.2 lm/W
x = y = 0.2496n
z = 0.004n, w = 0.0004n
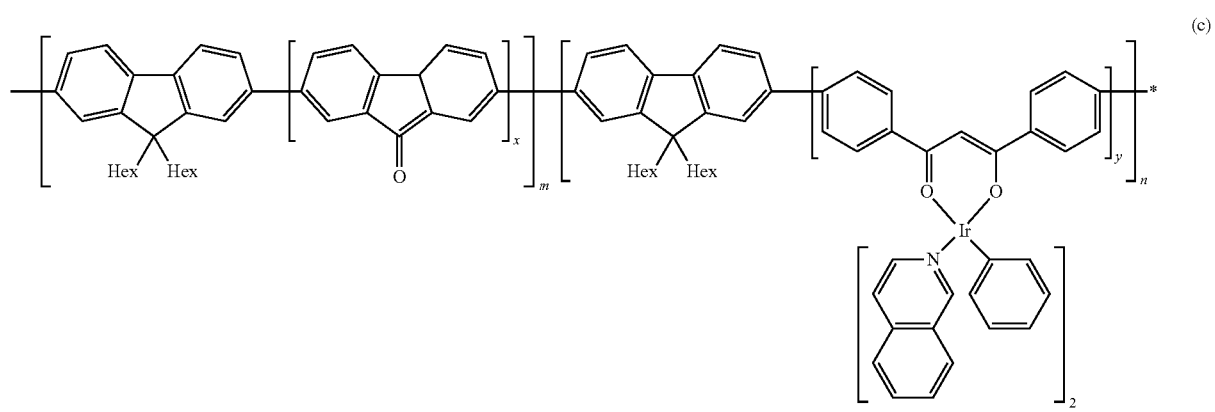
CIE xy (0.28, 0.32)
3.25 cd/A
x = 0.005, y = 0.015

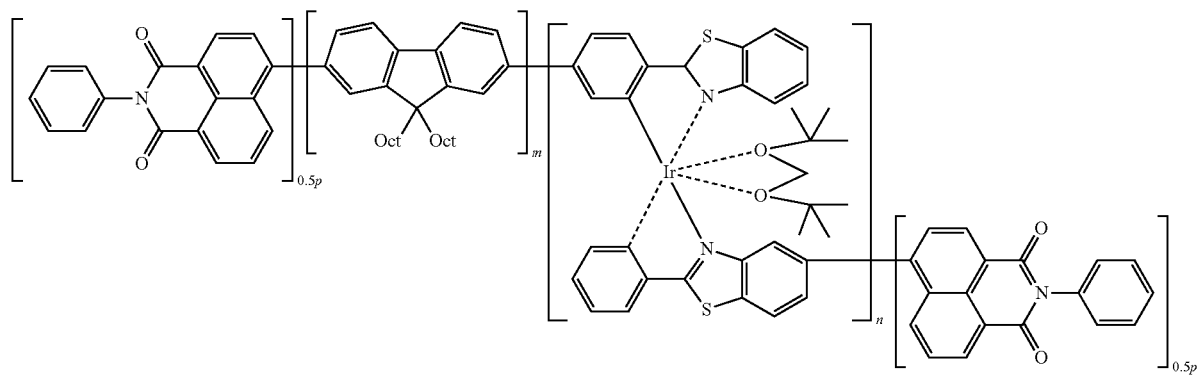
(d)
CIE xy (0.33, 0.34)
0.1 cd/A
m = 97, n = 2, p = 1
<Formula 103>
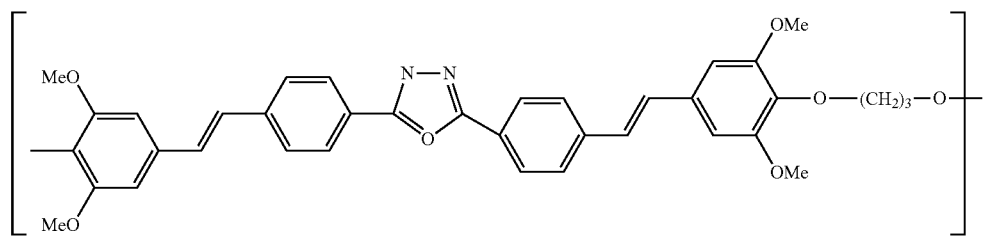
(a)
CIE xy (0.30, 0.37)
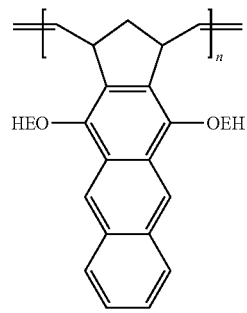
(b)
CIE xy (0.30, 0.34)

(c)
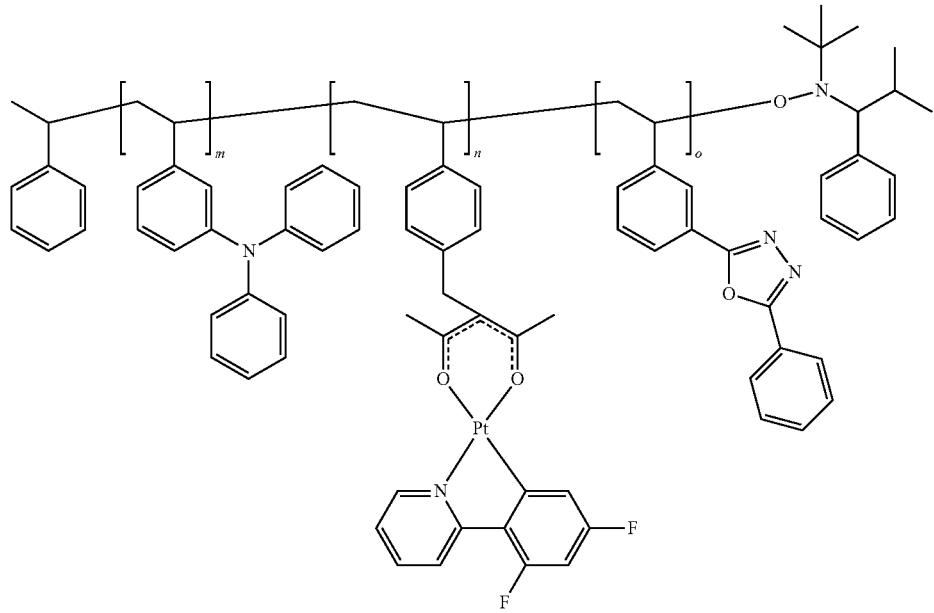
CIE xy (0.30, 0.34)
m:n:o = 10:1:2
<Formula 100>
(a)
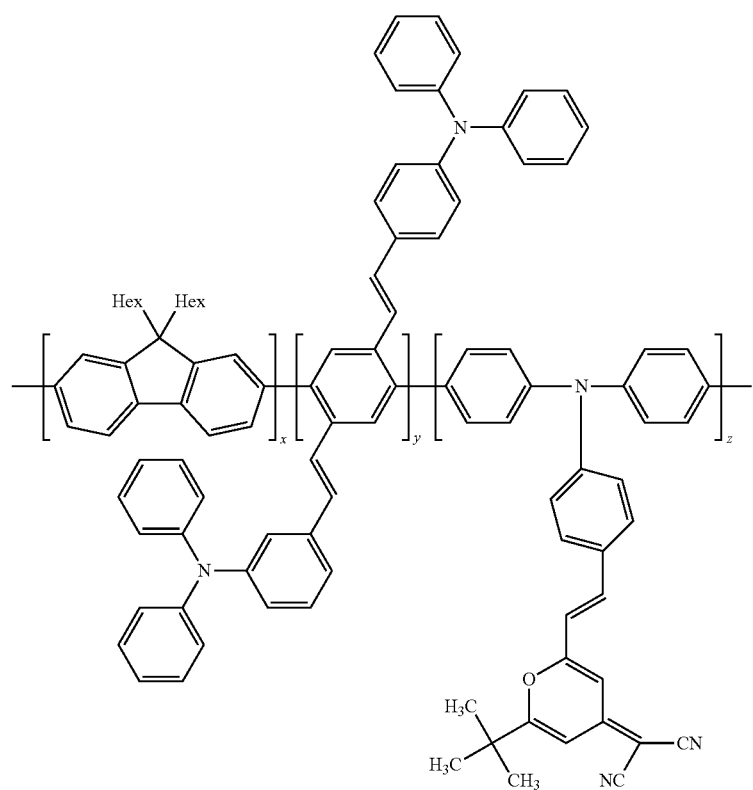
CIE xy (0.33, 0.35)
0.10 cd/A
x = 0.95, y = 0.03, z = 0.02

-continued
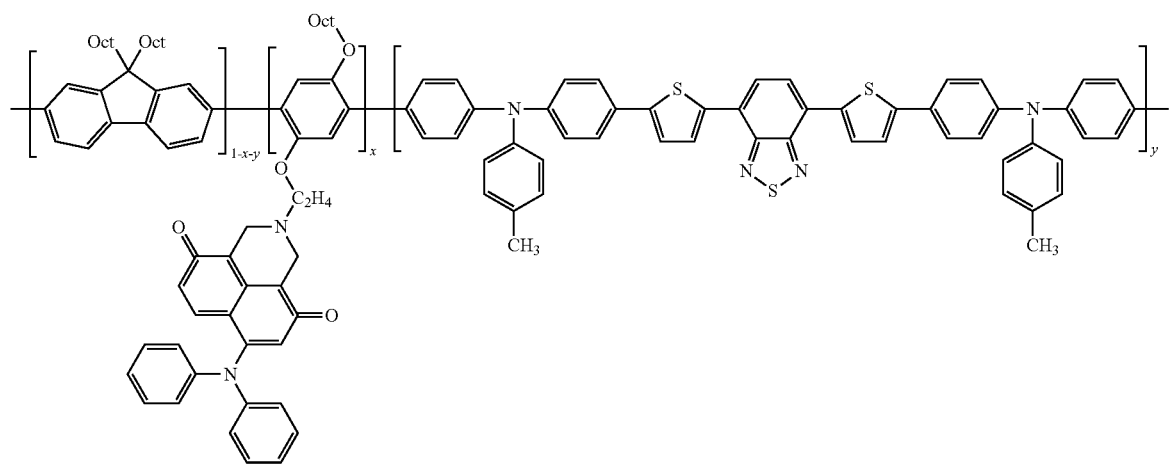
CIE xy (0.31, 0.34)
1.59 cd/A, 0.83 lm/W
x = 0.0002, y = 0.0003
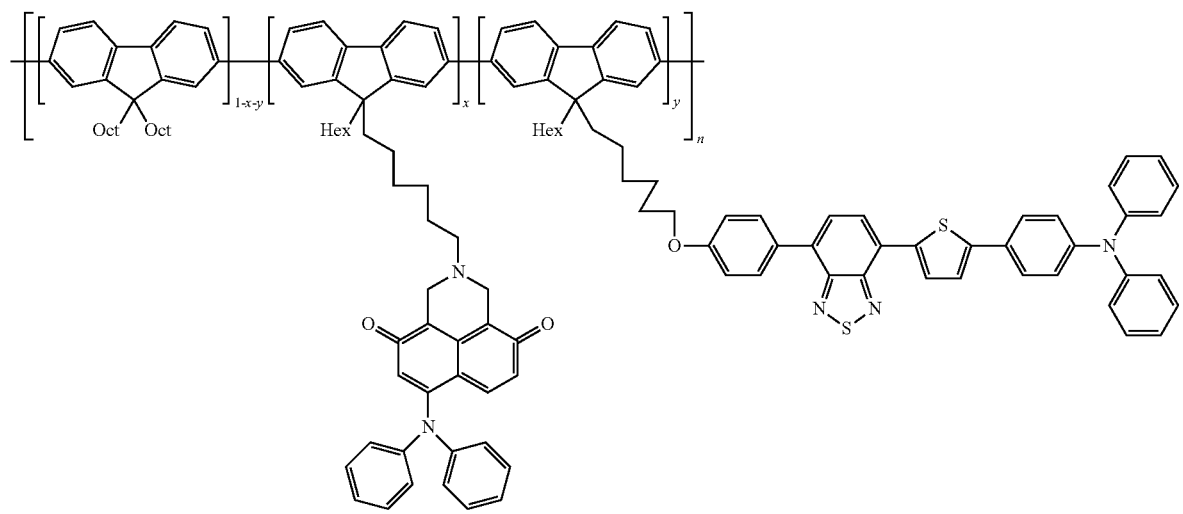
CIE xy (0.31, 0.32)
7.30 cd/A, 4.17 lm/W
x = 0.0002, y = 0.0002

-continued
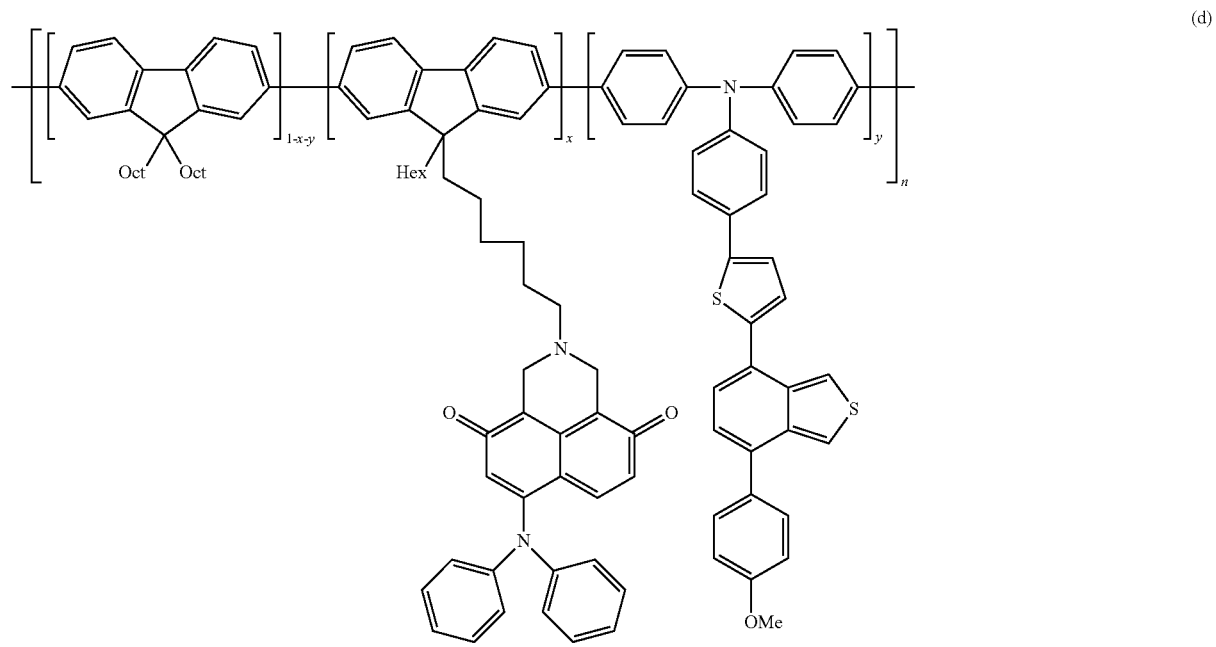
(d)
CIE xy (0.30, 0.31)
3.80 cd/A, 1.99 lm/W
x = 0.0002, y = 0.0002

(e)
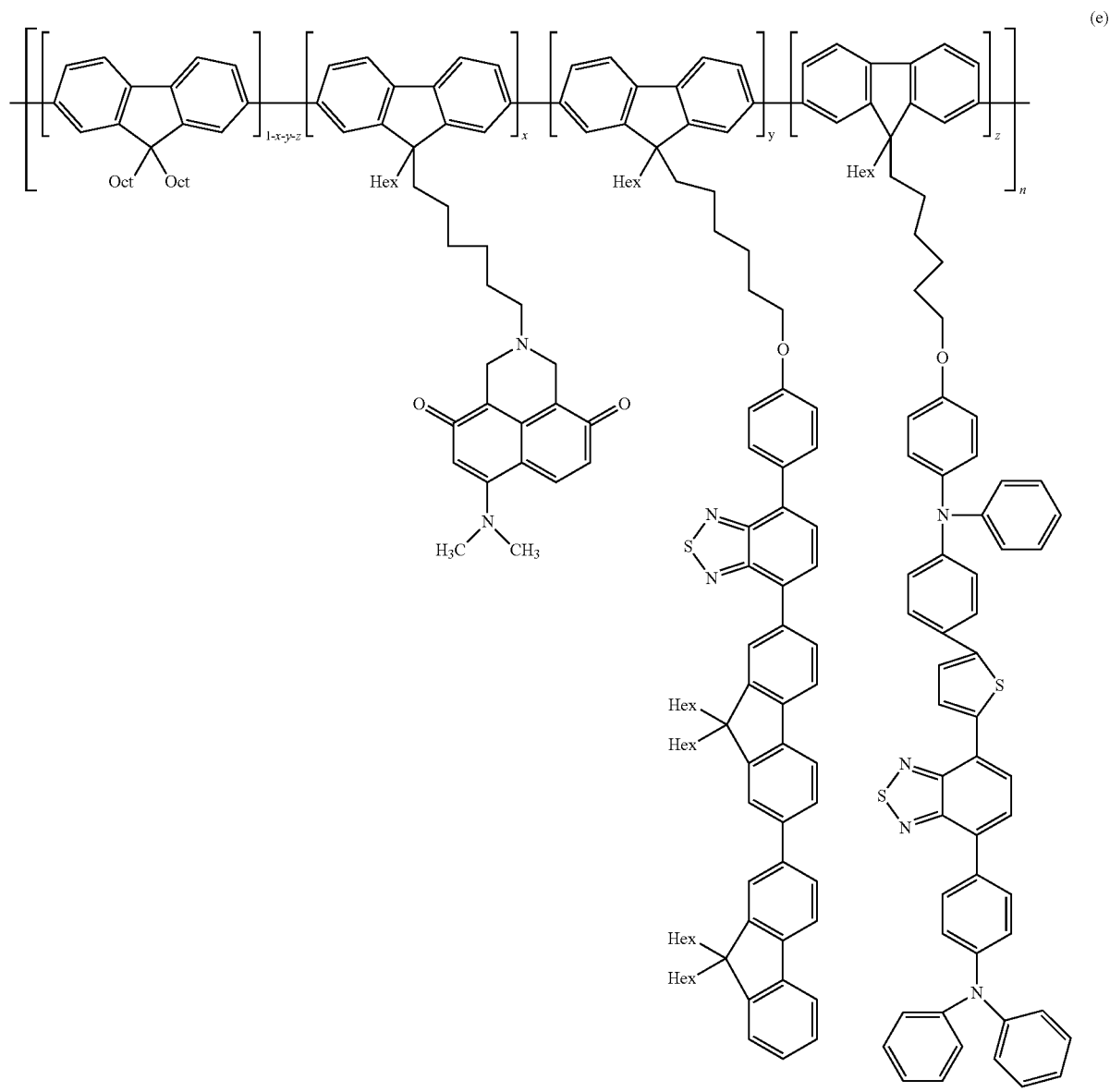
CIE xy (0.33, 0.36)
8.6 cd/A, 5.4 lm/W
x = 0.0005, y = 0.0005, z = 0.0002

-continued
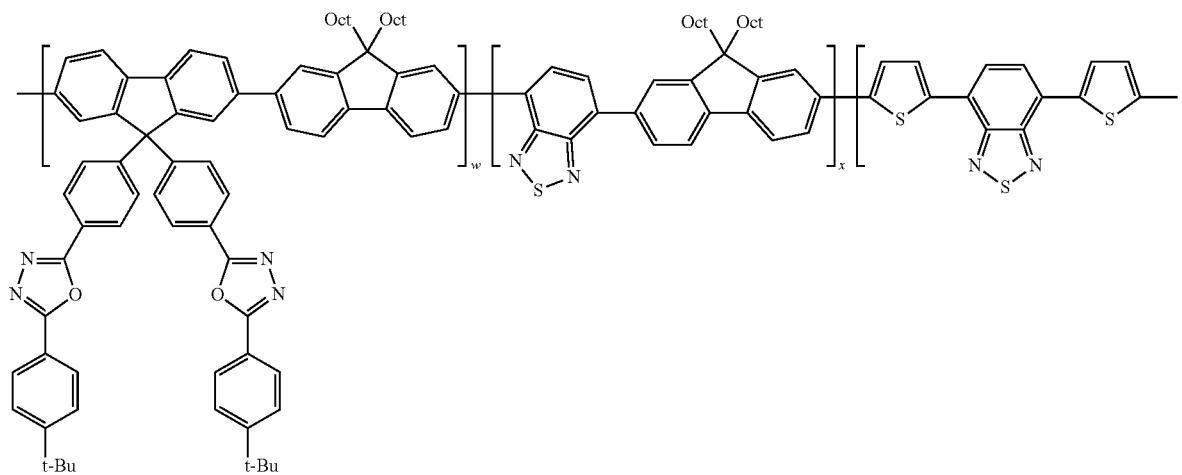
(f)
CIE xy (0.37, 0.36)
4.87 cd/A
w = z = 0.4938n
x = 0.0080n, y = 0.0044n
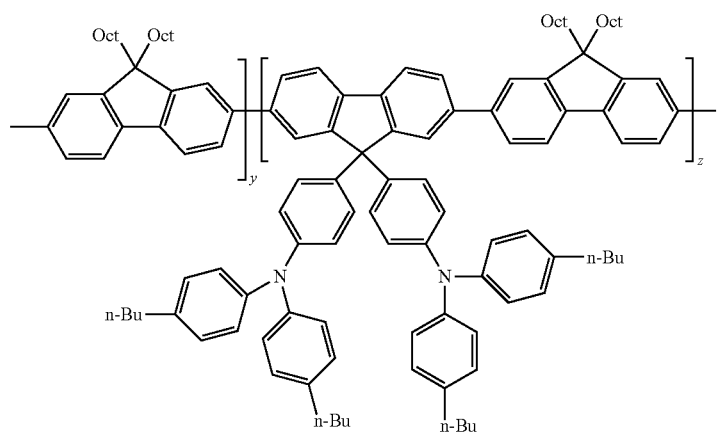
(a)
<Formula 101>
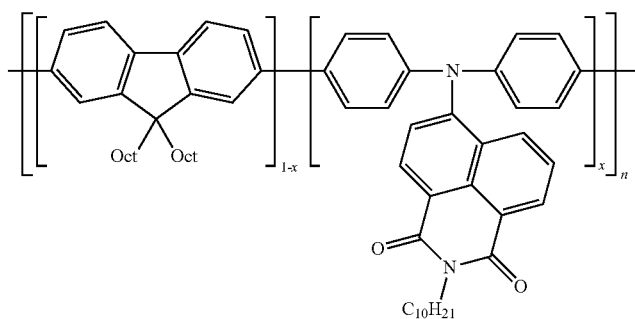
CIE xy (0.25, 0.35)
5.3 cd/A, 2.8 lm/W
x = 0.0005

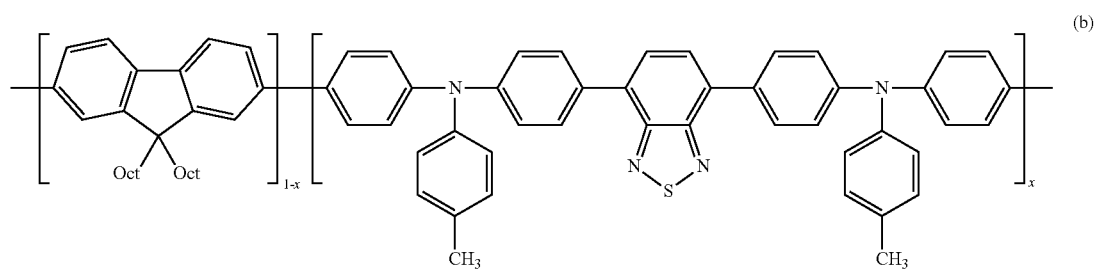
CIE xy (0.35, 0.34)
8.99 cd/A, 5.75 lm/W
x = 0.0003
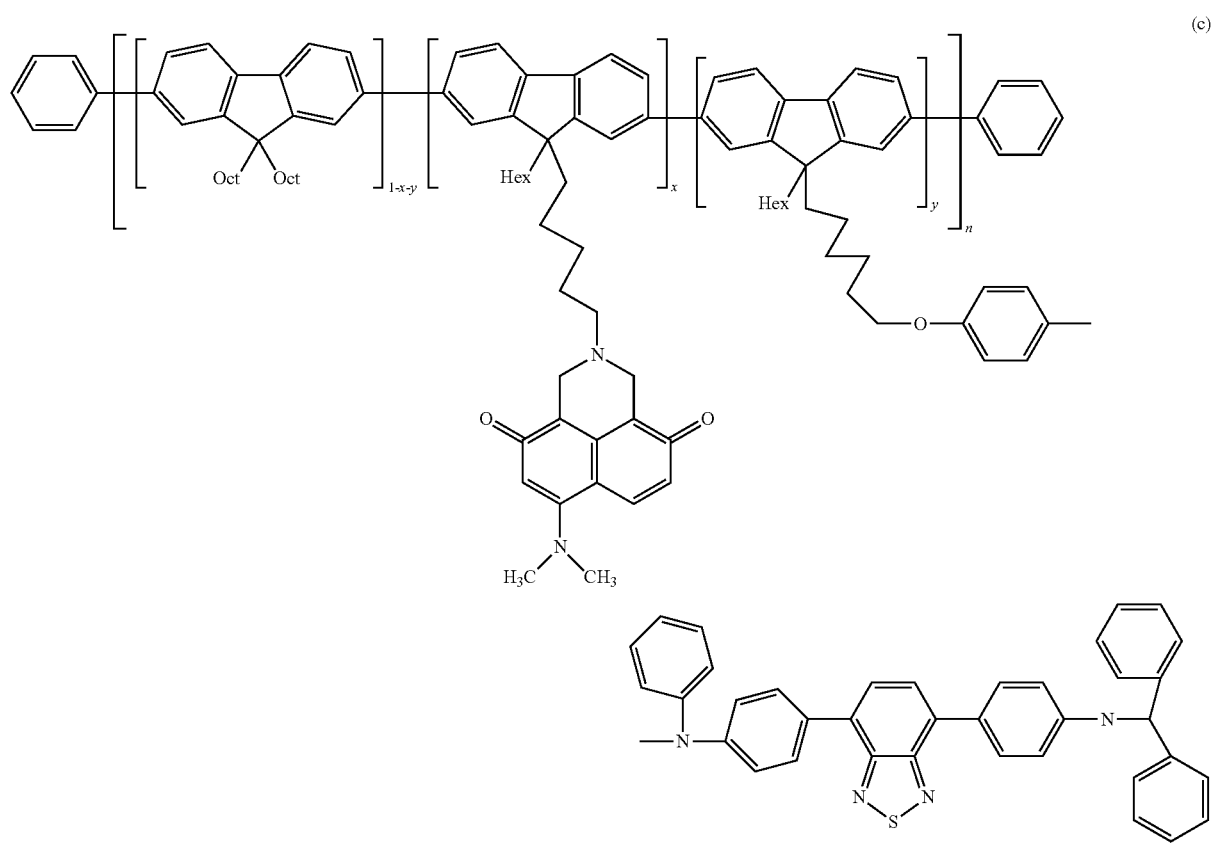
CIE xy (0.31, 0.36)
12.8 cd/A, 8.51 lm/W
x = 0.0005, y = 0.0003
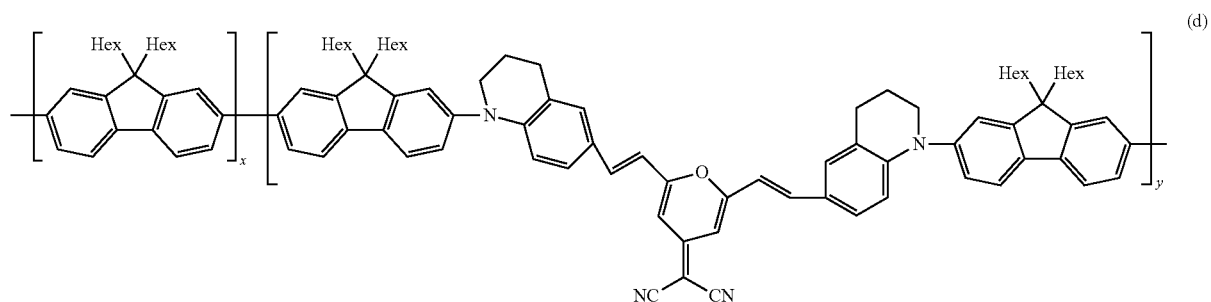
CIE xy (0.33, 0.31)
0.60 cd/A
x = 0.995, y = 0.005

(e)
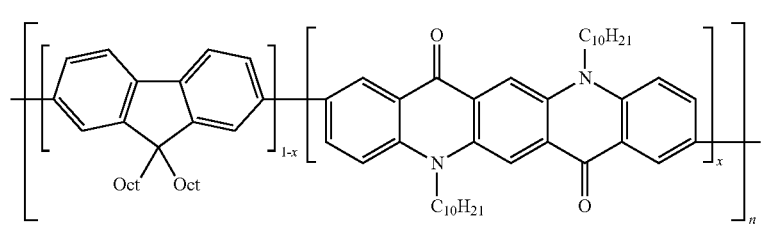
CIE xy (0.27, 0.35)
3.47 cd/A, 2.18 lm/W
x = 0.0003
(f)
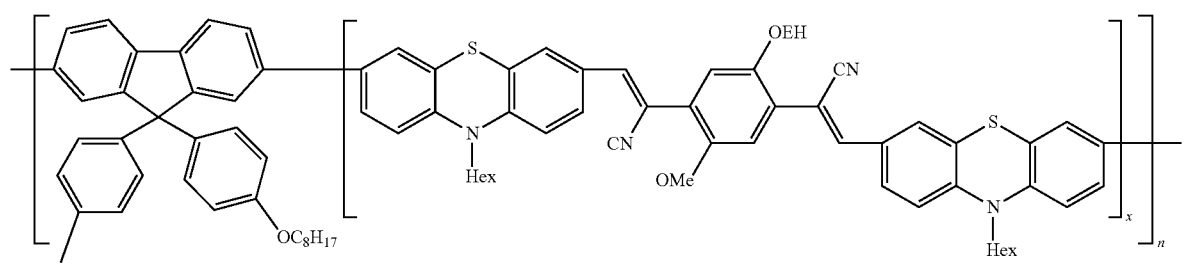
CIE xy (0.33, .39)
1.95 cd/A, 0.97 lm/W
x = 0.005
(a)
<Formula 102>
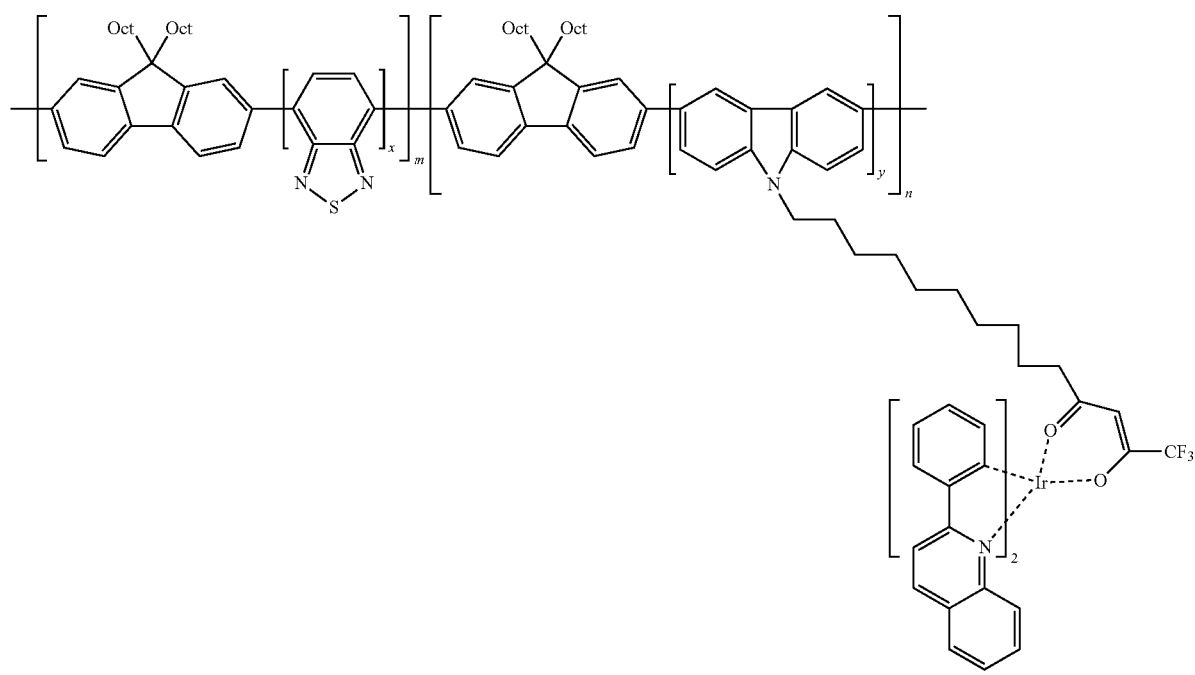
CIE xy (0.31, 0.36)
4.6 cd/A
x = 0.0003, y = 0.003

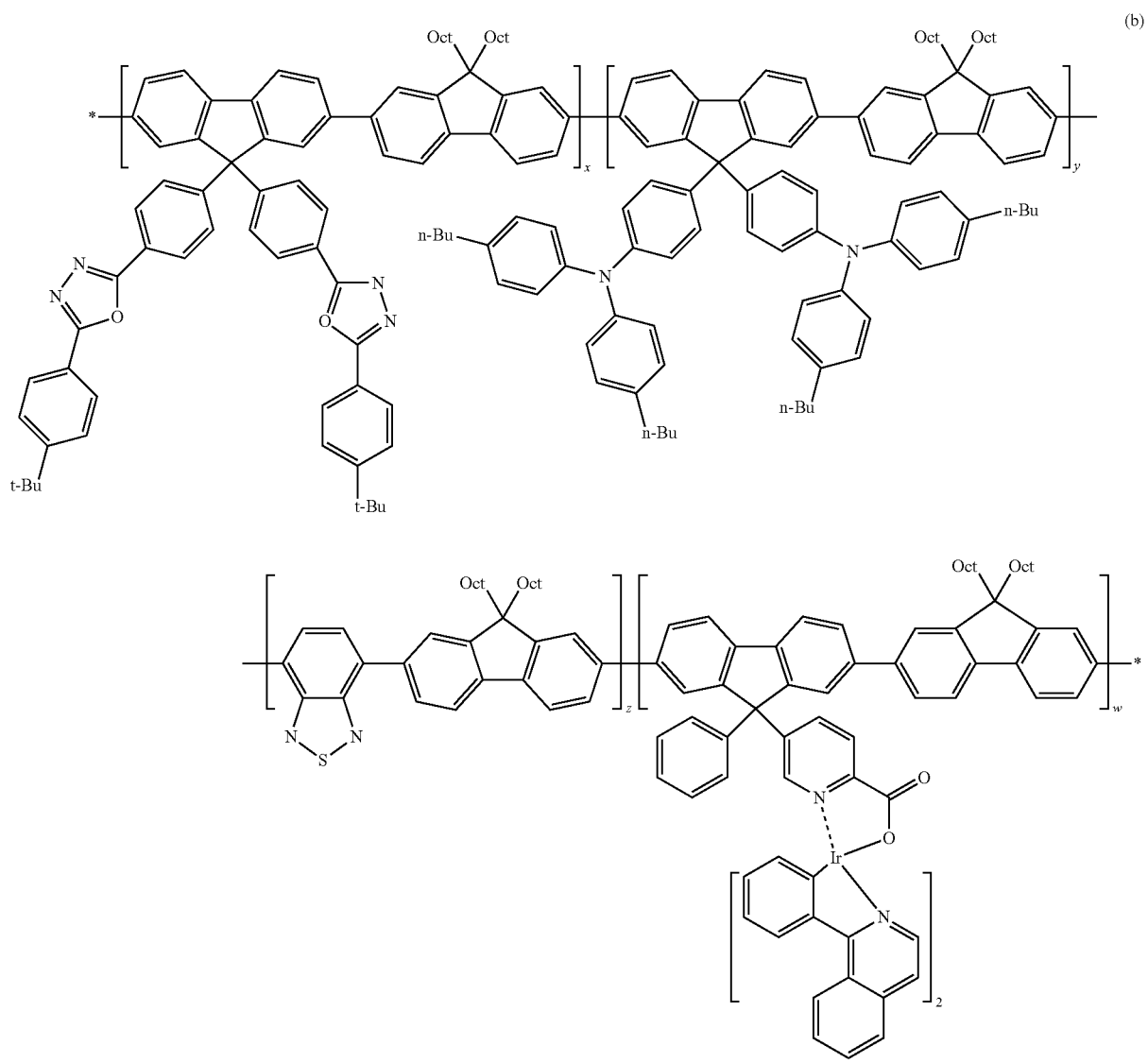
CIE xy (0.35, 0.38)
8.2 cd/A, 7.2 lm/W
x = y = 0.2496n
z = 0.004n, w = 0.0004n
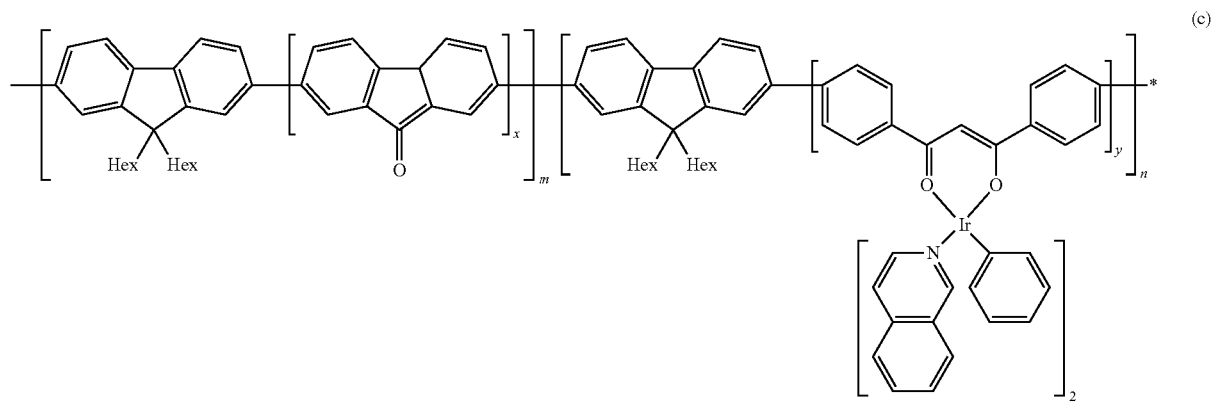
CIE xy (0.28, 0.32)
3.25 cd/A
x = 0.005, y = 0.015

-continued
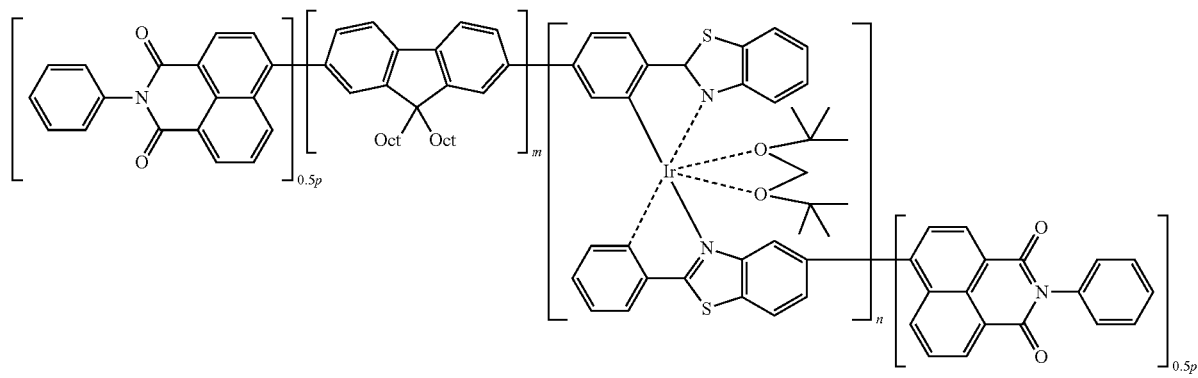
(d)
CIE xy (0.33, 0.34)
0.1 cd/A
m = 97, n = 2, p = 1
<Formula 103>
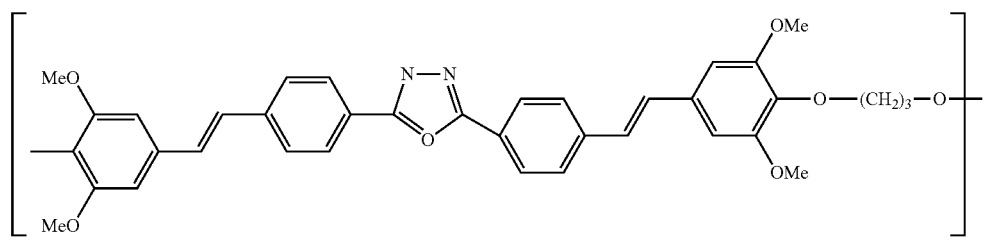
(a)
CIE xy (0.30, 0.37)
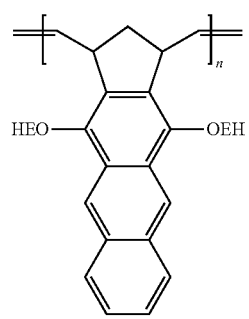
(b)
CIE xy (0.30, 0.34)

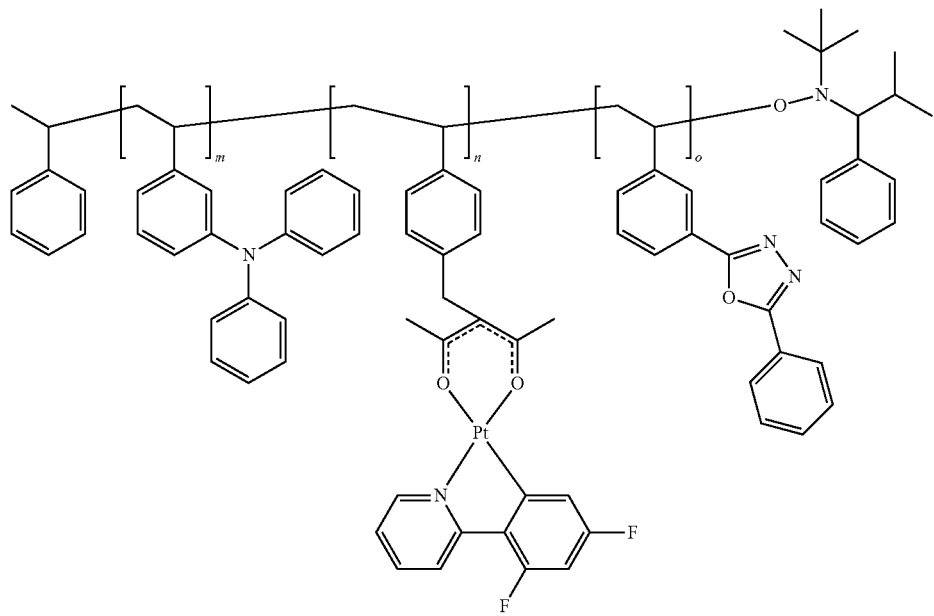

CIE xy (0.30, 0.34)
m:n:o = 10:1:2

In addition, the emitting layer 13 may be a mixture or blend of various high molecule and low molecule materials. From this, various colors including blue, green, red and white may be expressed.

The emitting layer 13 may have a thickness of approximately 50 to 15000 □, for example, approximately 200 to 1000 □. When the thickness of the emitting layer 13 satisfies the above-described range, substantially high efficiency and high brightness may be exhibited.

The hole injection layer 14 is formed on the emitting layer 13.

The hole injection layer 14 may include a known hole injection material. For example, the hole injection layer 14 may include at least one of a metal oxide and a hole injection organic material.

When the hole injection layer 14 includes a metal oxide, the metal oxide may include at least one metal oxide selected from $MoO_3$, $WO_3$ and $V_2O_5$. When the hole injection layer 14 is formed of metal oxide, a method of forming the hole injection layer 14 refers to the method of forming the electron injection layer 11.

When the hole injection layer 14 includes a hole injection organic material, a method of forming the hole injection layer 14 may refer to the method of forming the emitting layer 13.

As a non-limited example of the hole injection organic material, Fullerene ($C_{60}$), HAT-CN, $F_{16}CuP_C$, $CuP_C$, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA) or polyaniline/poly(4-styrenesulfonate) (PANI/PSS) may be used, but the present invention is not limited thereto.

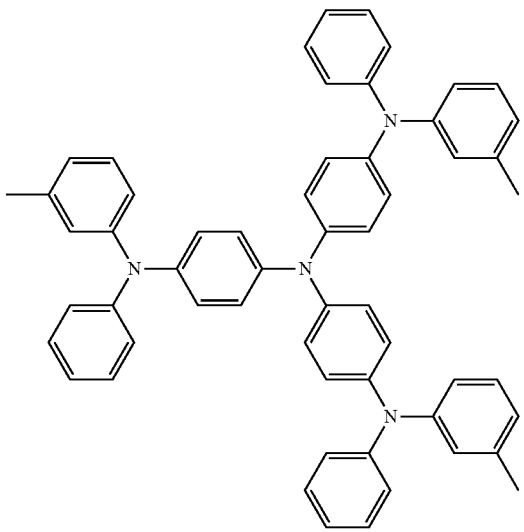

m-MTDATA

-continued

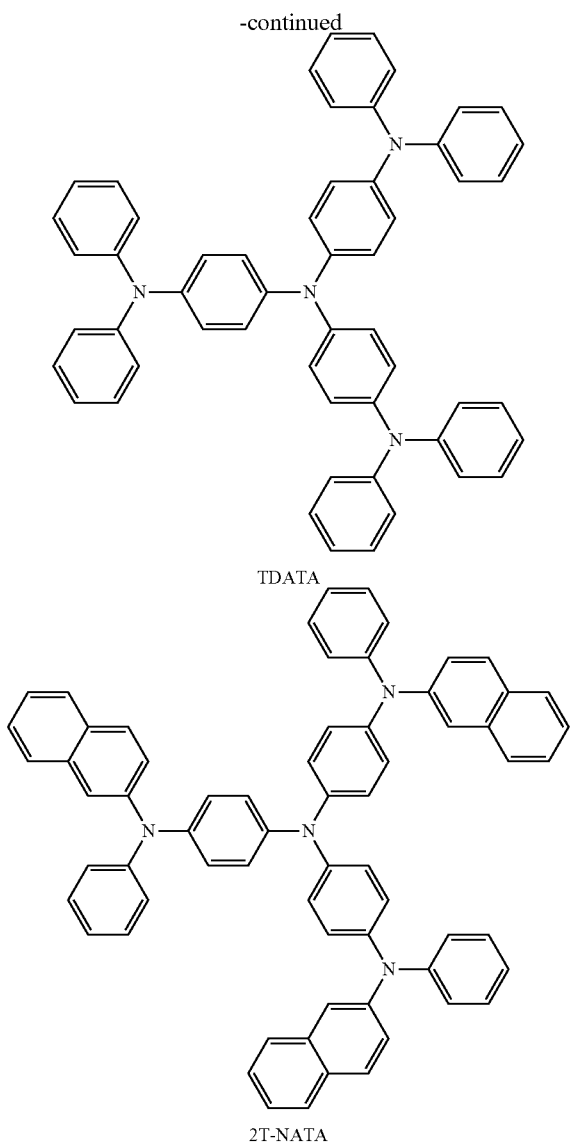

TDATA

2T-NATA

For example, the hole injection layer 14 may be a layer which is doped with the metal oxide in the hole injection organic material matrix. Here, a doping concentration may be 0.1 to 80 wt % based on a total weight of the hole injection layer 14.

The hole injection layer 14 may have a thickness of 10 to 10000 ▭, for example, 100 to 1000 ▭. When the thickness of the hole injection layer 14 satisfies the above range, a flexible inverted OLED having flexibility may be realized without an increase in drive voltage.

Meanwhile, although not shown in FIG. 1, a hole transport layer may be further interposed between the emitting layer 13 and the hole injection layer 14.

The hole transport layer may include a known hole transport material. For example, a non-limited example of the hole transport material which can be included in the hole transport layer may be, but is not limited to, 1,3-bis(carbazol-9-yl)benzene (MCP), 1,3,5-tris(carbazol-9-yl)benzene (TCP), 4,4',4"-tris(carbazol-9-yl)triphenylamine (TCTA), 4,4'-bis(carbazol-9-yl)biphenyl (CBP), N,N'-bis(naphthalen-1-yl)-N,N'-bis(phenyl)-benzidine (NPB), N,N'-bis(naphthalen-2-yl)-N,N'-bis(phenyl)-benzidine (β-NPB), N,N'-bis(naphthalen-1-yl)-N,N'-bis(phenyl)-2,2'-dimethylbenzidine (α-NPD), di-[4-(N,N-ditolyl-amino)-phenyl]cyclohexane (TAPC), N,N,N',N'-tetra-naphthalen-2-yl-benzidine (β-TNB), N4,N4,N4',N4'-tetra(biphenyl-4-yl)biphenyl-4,4'-diamine (TPD15), poly(9,9-dioctylfluorene-co-bis-N,N'-(4-butylphenyl)-bis-N,N'-phenyl-1,4-phenylenediamine) (PFB), poly(9,9'-dioctylfluorene-co-N-(4-butylphenyl)diphenylamine)(TFB), poly(9,9'-dioctylfluorene-co-bis-N,N'-(4-butylphenyl)-bis-N,N'-phenylbenzidine)(BFB), or poly(9,9-dioctylfluorene-co-bis-N,N'-(4-methoxyphenyl)-bis-N,N'-phenyl-1,4-phenylenediamine)(PFMO).

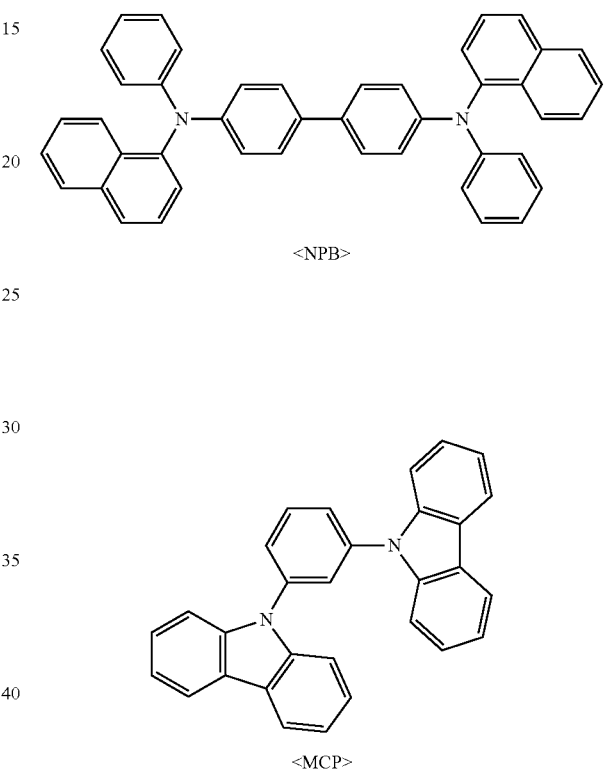

<NPB>

<MCP>

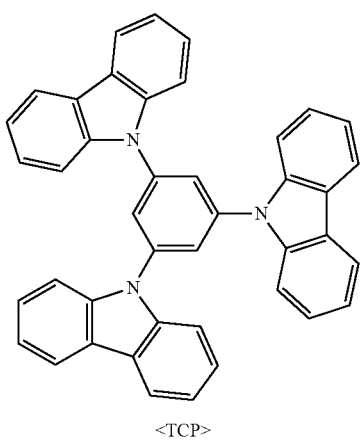

<TCP>

-continued

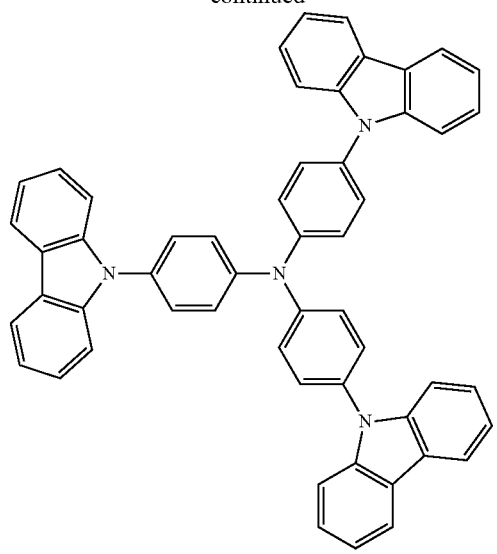
<TCTA>

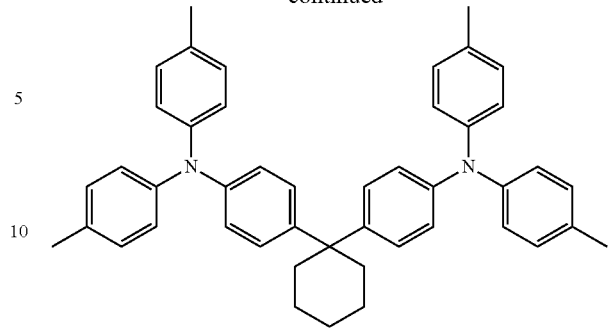
<TAPC>

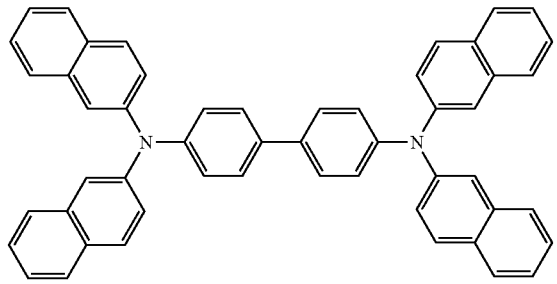
<β-TNB>

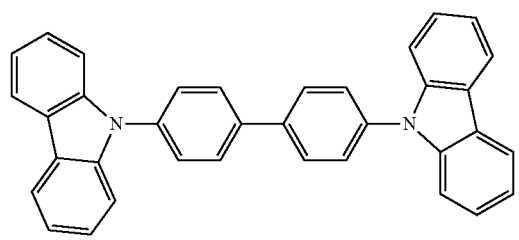
<CBP>

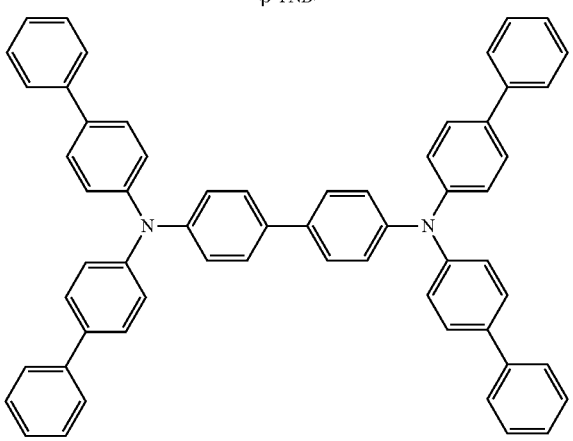
<TPD15>

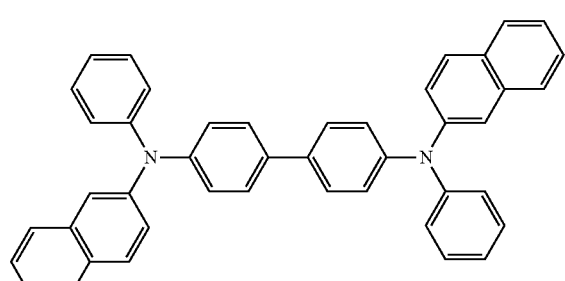
<β-NPB>

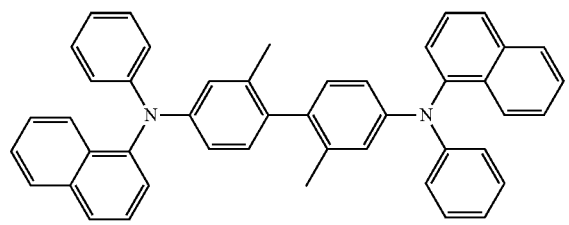
<α-NPD>

The hole transport layer, for example, in the case of TCTA, may serve to prevent diffusion of excitons from the emitting layer 13, as well as to transport holes.

The thickness of the hole transport layer may be 5 to 100 nm, for example, 10 to 60 nm. When the thickness of the hole transport layer satisfies the above range, a high quality flexible inverted OLED exhibiting high efficiency and high brightness may be realized.

The transparent anode 15 is formed on the hole injection layer 14.

The transparent anode 15 may have excellent conductivity and transparency since light generated from the emitting layer 13 is extracted to an external environment through the transparent anode 15.

The transparent anode 15 may include at least one of Ag, Al, Au, Mg, Mg/Ag bilayers, a Mg/Au bilayer, a Ca/Al bilayer, a Li/Al bilayer, an alloy of Mg and Ag, an alloy of Mg and Al, an alloy of Mg and Au, an alloy of Ca and Al, an alloy of Li and Al and metal oxides (for example, $MoO_3$, $WO_3$ and $V_2O_5$).

The transparent anode 15 may have a monolayer structure, which is a layer formed of at least one material, or a multilayer structure formed of at least two different materials.

For example, the transparent anode 15 may have a triple-layer structure in which MoO$_3$/Ag/MoO$_3$ are sequentially stacked or a bilayer structure in which Ag/MoO3 are sequentially stacked, but the present invention is not limited thereto.

The thickness of the transparent anode 15 may be 5 to 500 nm, for example, 10 to 60 nm. When the thickness of the transparent anode 15 satisfies the above range, light generated from the emitting layer 13 of the flexible inverted OLED 1 may be effectively extracted through the transparent anode 15.

The optical matching layer 16 is formed on the transparent anode 15.

The optical matching layer 16 may serve to enhance efficiency (that is, external efficiency) of light extracted to an external environment through the transparent anode 15 due to a principle of constructive interference.

The optical matching layer 16 may include a known material, for example, an inorganic layer including a metal oxide selected from MoO$_3$, WO$_3$ and V$_2$O$_5$, or an organic layer formed of a material having a refractive index of 1.5 to 2.0, and preferably, include an organic material selected from Alq$_3$ and Bebq$_2$, but the present invention is not limited thereto.

Hereinafter, while the flexible inverted OLED is described with reference to FIG. 4, it is merely an example, and therefore it should be understood by those of ordinary skill in the art that various modifications and other examples equal to the present invention can be provided.

For example, the integrated conductive substrate 100 of FIG. 4 may be replaced by the integrated conductive substrate 200 of FIG. 2 or the integrated conductive substrate 300 of FIG. 3. In addition, various modifications in which the optical matching layer 16 of the OLED 1 of FIG. 4 is omitted, a hole transport layer between the hole injection layer 14 and the emitting layer 13 is interposed, the electron-injection interfacial layer 12 is omitted, or the hole injection layer 14 is omitted can be provided.

Figure 5:
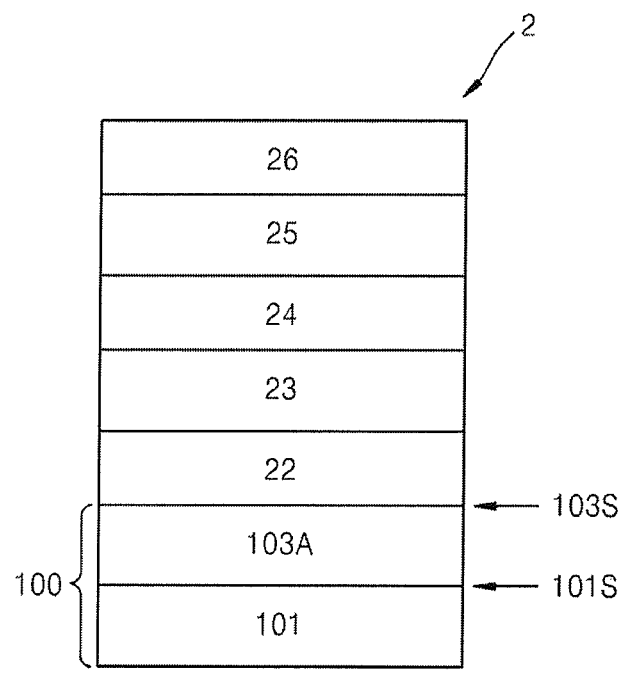
FIG. 5 is a schematic diagram of an OPV according to an exemplary embodiment.

FIG. 5 is a schematic diagram of a cross-section of a flexible inverted OPV 2 according to an exemplary embodiment.

The flexible inverted OPV 2 includes an integrated conductive substrate 100 simultaneously serving as a substrate and a cathode, a transparent anode 25 facing a semiconductor-type planarization layer 103A of the integrated conductive substrate 100, that is, a semiconductor layer 103, and a light active layer 23 interposed between the integrated conductive substrate 100 and the transparent anode 25. An electron extraction interface layer 22 is interposed between the integrated conductive substrate 100 and the light active layer 23, and a hole extraction layer 24 is interposed between the light active layer 23 and the transparent anode 25. In addition, an optical matching layer 26 is disposed on the transparent anode 25.

A bottom surface of a metal layer 101 of the integrated conductive substrate 100 of the flexible inverted OPV 2 is in contact with an external air.

Descriptions for the integrated conductive substrate 100 of FIG. 5 refer to the descriptions for FIG. 1.

Descriptions for the electron extraction interface layer 22 of FIG. 5 refer to the descriptions for the electron-injection interfacial layer 12 of FIG. 4, descriptions for the hole extraction layer 25 refer to the descriptions for the hole injection layer 15 of FIG. 4, and descriptions for the optical matching layer 26 refer to the descriptions for the optical matching layer 16 of FIG. 4.

The light active layer 23 may include a material which can separate holes and electrons from irradiated light. For example, the light active layer 23 may include an electron donor and a hole receptor. The light active layer 23 may have various structures, such as a single layer including the electron donor and the hole receptor, or multiple layers including a layer including the electron donor and a layer including the hole receptor.

The electron donor may include a p-type conductive polymer material including π-electrons. The electron donor may be, but is not limited to, P3HT(poly(3-hexylthiophene), polysiloxane carbazole, polyaniline, polyethylene oxide, poly(1-methoxy-4-(0-disperse red1)-2,5-phenylene-vinylene), poly-[2-methoxy-5-(2'-ethylhexyloxy)-1,4-phenylene vinylene] (MEH-PPV), poly[2-methoxy-5-3(3',7'-dimethyloctyloxy)-1-4-phenylene vinylene] (MDMO-PPV), poly((2,7-(9,9-dioctyl)-fluorene)-alt-5,5-(4',7'-di-2-thienyl-2',1',3'-benzothiadiazole) (PFDTBT), poly[N',0'-heptadecanyl-2,7-carbazole-alt-5,5-(4',7'-di-2-thienyl-2',1',3-benzothiazole (PCPDTBT), polyindole, polycarbazole, polypyridiazine, polyisothianaphthalene, polyphenylene sulfide, polyvinylpyridine, polythiopene, a polyfluorene, polypyridine, copper phthalocyanine (CuPc), subphthalocyanine (SubPc), chloro-aluminum phthalocyanine (ClAlPc), TAPC, or a derivative thereof. A composition (including all of a blend, a copolymer, etc.) of at least two of the examples of the electron donors may also be used.

The hole receptor may be, but is not limited to, fullerene having a high electron affinity (e.g., C60, C70, C74, C76, C78, C82, C84, C720 or C860), a fullerene derivative (e.g., [6,6]-phenyl-C61 butyric acid methyl ester (PCBM), C71-PCBM, C84-PCBM, or bis-PCBM), perylene, an inorganic semiconductor including a nano crystal such as CdS, CdTe, CdSe or ZnO, a carbon nanotube, a carbon nanorod graphene quantum dot, a carbon quantum dot, polybenzyimidazole (PBI), 3,4,9,10-perylenetetracarboxylic bisbenzimidazole (PTCBI) or a mixture thereof.

For example, the light active layer 23 may be, but is not limited to, a monolayer including P3HT as an electron donor and PCBM, which is a fullerene derivative as a hole receptor.

Light is irradiated onto the light active layer 23, and an exciton which is a pair of an electron and a hole is formed by light excitation. The exciton is separated into an electron and a hole by a difference in electron affinity between an electron donor and a hole receptor at an interface between the electron donor and the hole receptor.

Hereinafter, while the flexible inverted OPV is described with reference to FIG. 5, it is merely an example, and therefore it should be understood by those of ordinary skill in the art that various modifications and other examples equal to the present invention can be provided.

For example, the integrated conductive substrate 100 of FIG. 5 may be replaced by the integrated conductive substrate 200 of FIG. 2 or the integrated conductive substrate 300 of FIG. 3. In addition, various modifications in which the optical matching layer 26 of the OPV 2 of FIG. 5 is omitted, a hole transport layer between the hole injection layer 24 and the light active layer 23 is interposed, the electron extraction interface layer 22 is omitted, or the hole extraction layer 24 is omitted can be provided.

The electronic device is described with reference to, for example, the flexible inverted OLED of FIG. 4 and the flexible inverted OPV of FIG. 5, but the electronic device is not limited thereto. For example, the electronic device may be transformed into a normal-structure OLED in which a hole transport layer, an emitting layer, an electron transport layer, an electron-injection interfacial layer and a cathode are sequentially formed on the semiconductor layer 103 of the integrated conductive substrate 100, or a normal-structure OPV in which a hole transport layer, an emitting layer, an electron transport layer, an electron extraction interface layer and a cathode are sequentially formed on the semiconductor layer 103 of the integrated conductive substrate 100. Here, the integrated conductive substrate 100 may serve as a substrate and an anode.

The hole transport layer, the light active layer, the emitting layer, the electron-injection interfacial layer, and the electron extraction interface layer used when the integrated conductive substrate 100 is used as an anode can refer to the above-described descriptions.

The electron transport layer used when the integrated conductive substrate 100 is used as an anode may be formed on the emitting layer by any one selected from various known methods such as a vacuum deposition method, a spin coating method, a nozzle printing method, a casting method, a gravure printing method, a slot die coating method, a screen printing method, and an LB method. Here, deposition conditions and coating conditions differ according to the structure and thermal characteristic of a desired layer, but selected within a range similar to the above-described conditions for forming a hole transport layer.

As the electron transport material, a known electron transport material may be used.

For example, the electron transport layer may be, but is not limited to, a quinoline derivative such as tris(8-hydroxyquinoline)aluminum ($Alq_3$), bis(2-methyl-8-quinolinolate)-4-(phenylphenolato)aluminum (Balq), or bis(10-hydroxybenzo[h]quinolinato)-beryllium ($Bebq_2$), 2,9-dimethyl-4,7-diphenyl-1,10-phenanthroline (BCP), 4,7-diphenyl-1,10-phenanthroline (Bphen), 2,2',2"-(benzene-1,3,5-triyl)-tris(1-phenyl-1H-benzimidazole (TPBI), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 2,9-bis(naphthalen-2-yl)-4,7-diphenyl-1,10-phenanthroline (NBphen), tris(2,4,6-trimethyl-3-(pyridin-3-yl)phenyl)borane (3TPYMB), phenyl-dipyrenylphosphine oxide (POPy2), 3,3',5,5'-tetra[(m-pyridyl)-phen-3-yl]biphenyl (BP4mPy), 1,3,5-tri[(3-pyridyl)-phen-3-yl]benzene (TmPyPB), 1,3-bis[3,5-di(pyridin-3-yl)phenyl]benzene (BmPyPhB), bis(10-hydroxybenzo[h]quinolinato)beryllium (Bepq2), diphenylbis(4-(pyridin-3-yl)phenyl)silane (DPPS), 1,3,5-tri(p-pyrid-3-yl-phenyl)benzene (TpPyPB), 1,3-bis[2-(2,2'-bipyridine-6-yl)-1,3,4-oxadiazo-5-yl]benzene (Bpy-OXD), or 6,6'-bis[5-(biphenyl-4-yl)-1,3,4-oxadiazo-2-yl]-2,2'-bipyridyl (BP-OXD-Bpy).

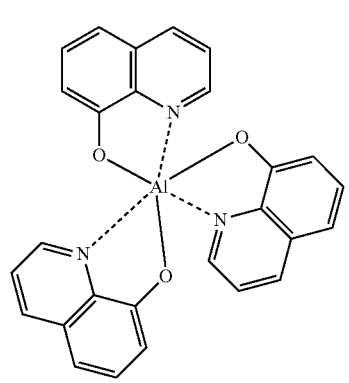

<Alq3>

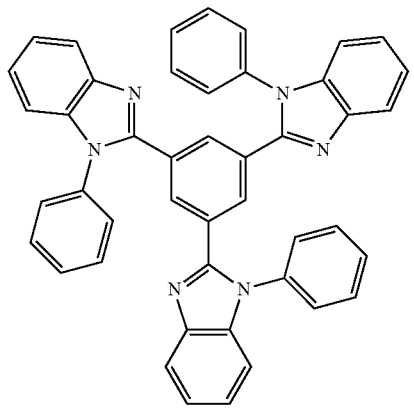

<TPBI>

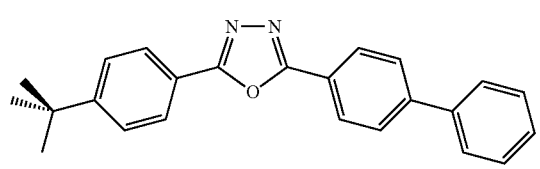

<PBD>

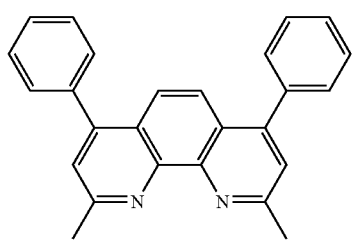

<BCP>

-continued

-continued
<POPy2>
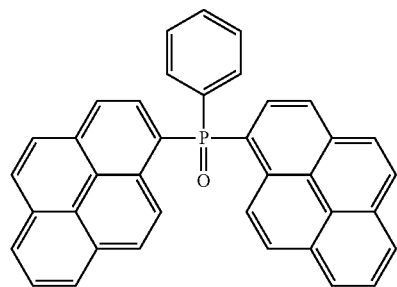
<BP4mPy>
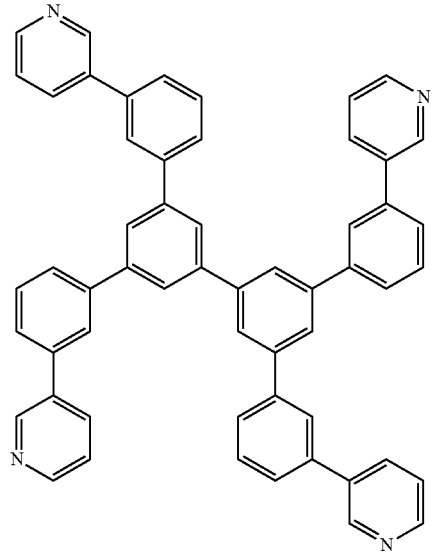
<TmPyPB>
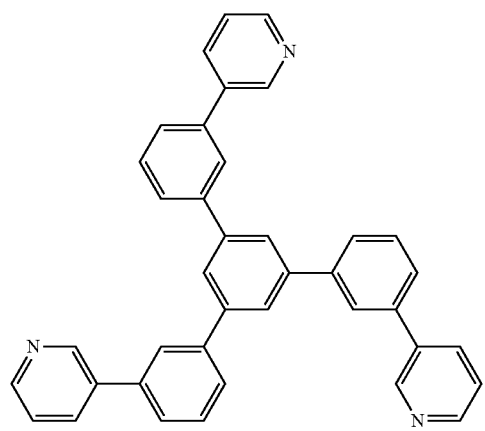
<BmPyPhB>
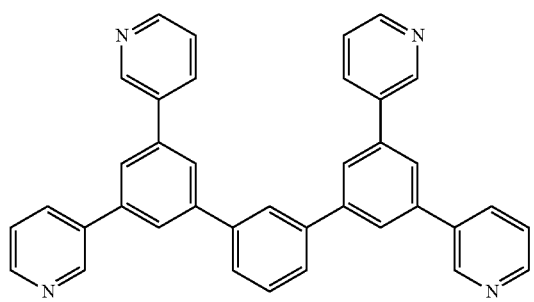
<Bepq2>
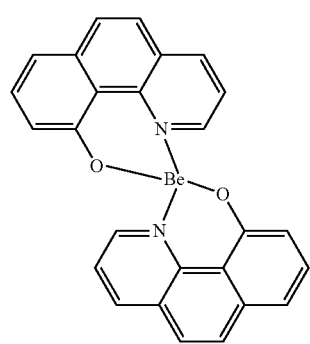
<Bebq2>
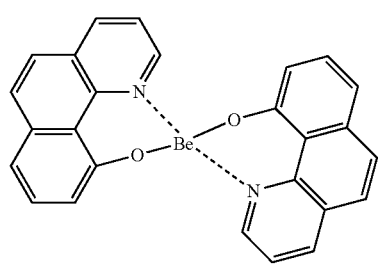

<DPPS>

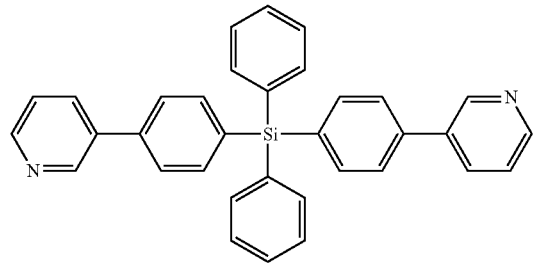

<TpPyPB>

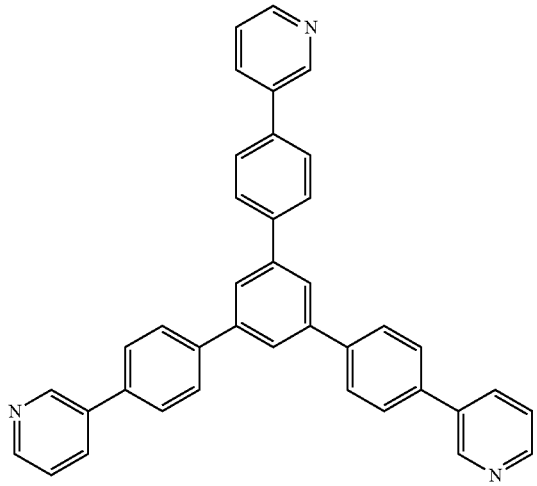

The electron transport layer may have a thickness of approximately 5 to 100 nm, for example, 15 to 60 nm. When the thickness of the electron transport layer satisfies the above range, an excellent electron transport characteristic may be obtained without a substantial increase in drive voltage.

An electron-injection interfacial layer may be formed on the electron transport layer. As a material for the electron-injection interfacial layer, a known electron injection material such as NaCl, $Li_2O$, BaO or lithium quinolate (Liq) may be used in addition to the above-described material, and conditions for depositing the electron-injection interfacial layer may be changed according to a compound to be used, but generally selected from the conditions almost the same as those for forming an organic emitting layer or a hole transport layer, except that a temperature is selected from 100 to 1500° C.

The electron-injection interfacial layer may have a thickness of approximately 0.1 to 10 nm, for example, 0.5 to 5 nm. When the thickness of the electron-injection interfacial layer satisfies the above range, a satisfactory electron injection characteristic may be obtained without a substantial increase in drive voltage.

In addition, the electron-injection interfacial layer may include a metal derivative such as LiF, NaCl, CsF, NaF, $Li_2O$, BaO, or $Cs_2CO_3$ at a content of 1 to 50% in a material for the electron transport layer such as $Alq_3$, TAZ, Balq, $Bebq_2$, BCP, TBPI, TmPyPB or TpPyPB, and may be formed to have a thickness of 1 to 100 nm by doping with a metal such as Li, Ca, Cs or Mg in the material for the electron transport layer.

As a material for the transparent cathode used when the integrated conductive substrate 100 is used as an anode, a metal, an alloy, an electron conductive compound or a combination thereof may be used. As a particular example, lithium (Li), magnesium (Mg), aluminum (Al), aluminum-lithium (Al—Li), calcium (Ca), magnesium-indium (Mg—In), magnesium-silver (Mg—Ag) may be used. In addition, to obtain a top-emissive device, ITO or IZO may be used.

The above-described optical matching layer may be included on the transparent cathode layer used when the integrated conductive substrate 100 is used as an anode.

EXAMPLES

Example 1

Manufacture of Integrated Conductive Substrate

A copper foil (thickness: 100 μm) having a first surface having a root mean square roughness (Rq) measured by an atomic force microscope of 30 nm was prepared as a metal layer by preparing a commercially-available copper foil having a surface having a root mean square roughness (Rq) measured by an atomic force microscope of 215 nm, and performing electro-polishing once.

Subsequently, an integrated conductive substrate was formed of a copper foil metal layer and a ZnO semiconductor layer (formed of a ZnO planarization layer) by preparing a sol-gel first mixture by mixing zinc acetate dehydrate (Sigma Aldrich Inc.) with a mixed solvent of 2-methoxy ethanol and ethanol amine (0.1 g/ml, a volume ratio of 96:4), forming a semiconductor layer with a ZnO planarization layer having a thickness of 40 nm by spin-coating the sol-gel first mixture on a first surface of the copper foil and performing thermal treatment at 400° C. for 30 minutes.

Manufacture of OLED

A silicon dioxide ($SiO_2$) pixel defining film (thickness: 350 nm) was formed on the ZnO semiconductor layer by a deposition method using a mask, and washed through sonication in acetone and isopropanol (IPA) for 20 minutes or more, respectively.

Afterward, a cesium carbonate ($Cs_2CO_3$) electron-injection interfacial layer was formed to have a thickness of 5 nm on the semiconductor layer of the integrated conductive substrate having a patterned pixel defining film by spin-coating a solution prepared by dissolving $Cs_2CO_3$ in a 2-ethoxyethanol solvent at a concentration of 5 mg/ml.

An emitting layer was formed at a thickness of 185 nm on the $Cs_2CO_3$ electron-injection interfacial layer without thermal treatment by spin-coating a solution prepared by dissolving a super yellow emitting material (0.9 wt % of poly(para-phenylene vinylene) polymer derivative solution; product name: PDY 132, Merck Corp.) in a toluene solvent, and performing thermal treatment at 80° C. for 20 minutes.

An MoO$_3$ hole injection layer was formed to have a thickness of 5 nm by vacuum-depositing MoO$_3$ (deposition speed of 0.3 Å/s) on the emitting layer.

A transparent anode was formed of Ag (15 nm) and MoO$_3$ (45 nm) by sequentially depositing Ag (deposition speed of 0.5 Å/s) and MoO$_3$ (deposition speed of 0.3 Å/s) on the MoO$_3$ hole injection layer, and therefore an OLED was manufactured.

Components of the OLED were summarized, and are shown in Table 1.

TABLE 1

| Function | Material | Thickness |
|---|---|---|
| Transparent anode | Ag/MoO$_3$ | 15 nm/45 nm |
| Hole injection layer | MoO$_3$ | 5 nm |
| Emitting layer | Super Yellow | 185 nm |
| Electron-injection interfacial layer | Cs$_2$CO$_3$ | 5 nm |
| Substrate and cathode | ZnO semiconductor layer (formed of a ZnO planarization layer) | 40 nm |
|  | Copper foil metal layer | 0.1 mm |

Efficiency of the OLED was measured using a Keithley 236 source measuring device and a Minolta CS 2000 spectroradiometer, and it was confirmed from the result that the maximum efficiency was 5 cd/A.

Example 2

Manufacture of Integrated Conductive Substrate

A copper foil (thickness: 100 μm) having a first surface having a root mean square roughness (Rq) measured by an atomic force microscope of 30 nm was prepared as a metal layer by preparing a commercially-available copper foil having a surface having a root mean square roughness (Rq) measured by the atomic force microscope of 215 nm, and performing electro-polishing once.

Subsequently, an integrated conductive substrate was formed of a copper foil metal layer and a ZnO semiconductor layer (formed of a ZnO planarization layer and a ZnO intermediate layer) by preparing a sol-gel first mixture by mixing zinc acetate dehydrate (Sigma Aldrich Inc.) with a mixed solvent of 2-methoxy ethanol and ethanol amine (0.1 g/ml, a volume ratio of 96:4), forming a ZnO planarization layer having a thickness of 30 nm by spin-coating the sol-gel first mixture on a first surface of the copper foil and performing thermal treatment at 400° C. for 30 minutes, and forming a ZnO intermediate layer having a thickness of 20 nm by depositing ZnO on the ZnO planarization layer using a sputter deposition method.

Manufacture of OLED

An OLED was manufactured on the integrated conductive substrate using the same method as described in Example 1. Components of the OLED were summarized as shown in Table 2.

TABLE 2

| Function | Material | Thickness |
|---|---|---|
| Transparent anode | Ag/MoO$_3$ | 15 nm/45 nm |
| Hole injection layer | MoO$_3$ | 5 nm |
| Emitting layer | Super Yellow | 185 nm |
| Electron-injection interfacial layer | Cs$_2$CO$_3$ | 5 nm |
| Substrate and Cathode | ZnO semiconductor layer | ZnO intermediate layer[2] | 20 nm |
|  |  | ZnO planarization layer[1] | 30 nm |
|  | Copper foil metal layer |  | 0.1 mm |

[1] formed using a solution process
[2] formed using a sputter deposition method Efficiency of the OLED was measured using a Keithley 236 source measuring device and a Minolta CS 2000 spectroradiometer, and it was confirmed from the result that the maximum efficiency was 5.2 cd/A.

Example 3

Manufacture of Integrated Conductive Substrate

A copper foil (thickness: 100 μm) having a first surface having a root mean square roughness (Rq) measured by an atomic force microscope of 30 nm was prepared as a metal layer by preparing a commercially-available copper foil having a surface having a root mean square roughness (Rq) measured by the atomic force microscope of 215 nm, and performing electro-polishing once.

Subsequently, an integrated conductive substrate was formed of a copper foil metal layer and a ZnO semiconductor layer (formed of a ZnO intermediate layer and a ZnO planarization layer) by forming a ZnO intermediate layer having a thickness of 20 nm by depositing ZnO on a first surface of the copper foil using a sputter deposition method, and forming a ZnO planarization layer having a thickness of 30 nm by spin-coating a sol-gel first mixture prepared by mixing zinc acetate dehydrate (Sigma Aldrich Inc.) with a mixed solvent of 2-methoxy ethanol and ethanol amine (0.1 g/ml, a volume ratio of 96:4) on the ZnO intermediate layer and performing thermal treatment at 400° C. for 30 minutes.

Manufacture of OLED

An OLED was manufactured on the integrated conductive substrate using the same method as described in Example 1. Components of the OLED were summarized as shown in Table 3.

TABLE 3

| Function | Material | Thickness |
|---|---|---|
| Transparent anode | Ag/MoO$_3$ | 15 nm/45 nm |
| Hole injection layer | MoO$_3$ | 5 nm |
| Emitting layer | Super Yellow | 185 nm |
| Electron-injection interfacial layer | Cs$_2$CO$_3$ | 5 nm |
| Substrate and Cathode | ZnO semiconductor layer | ZnO planarization layer[4] | 30 nm |
|  |  | ZnO intermediate layer[3] | 20 nm |
|  | Copper foil metal layer |  | 0.1 mm |

[3] formed using a sputter deposition method
[4] formed using a solution process Efficiency of the OLED was measured using a Keithley 236 source measuring device and a Minolta CS 2000 spectroradiometer, and it was confirmed from the result that the maximum efficiency was 5.1 cd/A.

Example 4

An OPV was manufactured by the same method as described in Example 1, except that a light active layer having a thickness of 80 nm was formed, instead of an emitting layer, by spin coating a solution prepared by dissolving poly[[9-(1-octylnonyl)-9H-carbazole-2,7-diyl]-2,5-thiophenediyl-2,1,3-benzothiadiazole-4,7-diyl-2,5-thiophenediyl] (PCDTBT) and phenyl-$C_{70}$-butyric acid methyl ester ($PC_{70}BM$; a weight ratio of 1:4) in o-dichlorobenzene at 60° C. for 12 hours at a concentration of 7 mg/1 ml on a $Cs_2CO_3$ electron extraction interface layer at 1600 rpm for 60 seconds, and performing thermal treatment at 80° C. for 20 minutes. Components of the OPV were summarized as shown in Table 4.

TABLE 4

| Function | Material | Thickness |
| --- | --- | --- |
| Transparent anode | $Ag/MoO_3$ | 15 nm/45 nm |
| Hole extraction layer | $MoO_3$ | 5 nm |
| Light active layer | PCDTBT:PC70BM | 80 nm |
| Electron extraction interface layer | $Cs_2CO_3$ | 5 nm |
| Substrate and Cathode | ZnO semiconductor layer (formed of a ZnO planarization layer) | 40 nm |
| | Copper foil metal layer | 0.1 mm |

A voltage-current density characteristic of the OPV of Example 4 was evaluated, and the result is summarized in Table 5. In the evaluation of the voltage-current density characteristic, the OPV was irradiated by light with an intensity of 100 mW/cm$^2$ using a xenon lamp as a light source (solar condition of the xenon lamp (AM1.5) was corrected using a standard photovoltaic cell).

Meanwhile, photoelectric conversion efficiency (PCE; %) was calculated from a short current ($J_{SC}$), an open-circuit voltage ($V_{OC}$), and a fill factor (FF), which were calculated from the measured voltage-current graph, and then summarized in Table 5.

TABLE 5

| Open-circuit voltage ($V_{OC}$) (V) | Short current ($J_{SC}$) (mA/cm$^2$) | Fill factor (FF) (%) | Photoelectric conversion efficiency (PCE) (%) |
| --- | --- | --- | --- |
| 0.52 | 0.85 | 55 | 2.43 |

From Table 5, it was confirmed that the OPV of Example 4 had excellent photoelectric conversion efficiency.

The present invention provides an integrated conductive substrate serving as a substrate and an electrode for an electronic device and an electronic device using the same.

While the invention has been shown and described with reference to certain exemplary embodiments thereof, it will be understood by those skilled in the art that various modifications in form and details may be made therein without departing from the spirit and scope of the invention as defined by the appended claims.

The invention claimed is:

1. A conductive substrate comprising:
 a metal layer comprising a non-ferrous metal, the metal layer comprising a first surface having a first root mean square roughness (Rq); a first semiconductor layer formed on the first surface of the metal layer using a liquid application process that applies liquid containing a first semiconductive material on the first surface to form the first semiconductor layer, the first semiconductor layer comprising a second surface facing away from the first surface, the second surface having a second root mean square roughness; and
 a second semiconductor layer formed on the second surface using a non-liquid deposition process that deposits a second semiconductive material to form the second semiconductor layer, the second semiconductor layer comprising a third surface facing away from the second surface, the third surface having a third root mean square roughness,
 wherein the second surface of the first semiconductor layer does not follow a morphology of the first surface due to the liquid application process of forming the first semiconductor layer, and accordingly the second root mean square roughness is substantially different from and smaller than the first root mean square roughness, whereas the third surface of the second semiconductor layer generally follows a morphology of the second surface due to the non-liquid deposition process, and accordingly the third root mean square roughness is substantially different from and smaller than the first root mean square roughness.

2. The substrate according to claim 1, wherein the first root mean square roughness is 10 nm or more, and the second root mean square roughness is less than 10 nm.

3. The substrate according to claim 1, wherein the first semiconductive material is different from the second semiconductive material.

4. The substrate according to claim 3, wherein the second root mean square roughness of the second surface is substantially equal to the third root mean square roughness of the third surface.

5. The substrate according to claim 1, wherein the non-ferrous metal includes at least one selected from copper, aluminum, gold, platinum, palladium, silver, nickel, lead, niobium, zinc and tin.

6. The substrate according to claim 1, wherein at least one of the first and second semiconductor layers includes at least one selected from the group consisting of $TiO_x$ (x is a real number of 1 to 3), indium oxide ($In_2O_3$), tin oxide ($SnO_2$), zinc oxide (ZnO), zinc tin oxide, gallium oxide ($Ga_2O_3$), tungsten oxide ($WO_3$), aluminum oxide, titanium oxide, vanadium oxide ($V_2O_5$, $VO_2$, $V_4O_7$, $V_5O_9$ or $V_2O_3$), molybdenum oxide ($MoO_3$ or $MoO_x$), copper (II) oxide (CuO), nickel oxide (NiO), copper aluminum oxide ($CAOCuAlO_2$), zinc rhodium oxide ($ZROZnRh_2O_4$), iron oxide, chromium oxide, bismuth oxide, indium-Gallium Zinc Oxide (IGZO) and $ZrO_2$.

7. The substrate according to claim 1, wherein the metal layer has a thickness of 50 nm to 5 mm, and the first and second semiconductor layers have a thickness of 5 to 300 nm.

8. An electronic device comprising the conductive substrate of claim 1.

9. The device according to claim 8, wherein the metal layer of the conductive substrate comprises a bottom surface that faces away from the first surface and is exposed to air without contacting an object.

10. A flexible inverted organic light emitting diode (OLED), comprising:
 the conductive substrate of claim 1;
 a transparent anode placed over the third surface of the second semiconductor layer; and
 an emitting layer interposed between the second semiconductor layer and the transparent anode,
 wherein the conductive substrate serves as both a substrate for supporting the OLED and a cathode of the OLED.

11. The OLED of claim 10, wherein the metal layer of the conductive substrate comprises a bottom surface that faces away from the first surface and is exposed to air without contacting an object.

12. A flexible normal-structure OLED, comprising:
the conductive substrate of claim 1;
a transparent cathode placed over the third surface of the second semiconductor layer; and
an emitting layer interposed between the second semiconductor layer and the transparent cathode,
wherein the conductive substrate serves as both a substrate for supporting the OLED and an anode of the OLED.

13. The OLED of claim 12, wherein the metal layer of the conductive substrate comprises a bottom surface that faces away from the first surface and is exposed to air without contacting an object.

* * * * *